United States Patent
Wang et al.

(10) Patent No.: US 11,636,557 B2
(45) Date of Patent: *Apr. 25, 2023

(54) SYSTEMS AND METHODS FOR ENHANCED POWER SYSTEM MODEL VALIDATION

(71) Applicant: General Electric Company, Schenectady, NY (US)

(72) Inventors: Honggang Wang, Clifton Park, NY (US); Manu Parashar, Seattle, WA (US); Radhakrishnan Srinivasan, Duvall, WA (US); Miaolei Shao, Altamont, NY (US); Shruti Dwarkanath Rao, Schenectady, NY (US); Juan Sanchez-Gasca, Glenville, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 523 days.

This patent is subject to a terminal disclaimer.

(21) Appl. No.: 16/717,474

(22) Filed: Dec. 17, 2019

(65) Prior Publication Data
US 2020/0380618 A1    Dec. 3, 2020

Related U.S. Application Data

(63) Continuation-in-part of application No. 16/425,797, filed on May 29, 2019.

(51) Int. Cl.
*G06Q 50/06* (2012.01)
*G06F 30/18* (2020.01)
*G06F 30/27* (2020.01)

(52) U.S. Cl.
CPC ............. *G06Q 50/06* (2013.01); *G06F 30/18* (2020.01); *G06F 30/27* (2020.01)

(58) Field of Classification Search
CPC .......... G05B 19/042; G05B 2219/2639; G06Q 10/067; G06Q 50/06; G06F 30/18; G06F 30/27; G06F 30/30
See application file for complete search history.

(56) References Cited

U.S. PATENT DOCUMENTS

| | | |
|---|---|---|
| 5,390,106 A | 2/1995 | Cederblad et al. |
| 9,092,593 B2 | 7/2015 | Nasle |

(Continued)

FOREIGN PATENT DOCUMENTS

| | | |
|---|---|---|
| CN | 103530819 A | 1/2014 |
| CN | 106709626 A | 5/2017 |

(Continued)

OTHER PUBLICATIONS

Q. Y. Wang and Y. Wang, "Magnetic Saturation in Synchronous Generator Dynamic Models for Power System Stability Studies," 2019 IEEE Canadian Conference of Electrical and Computer Engineering (CCECE), 2019, pp. 1-4, doi: 10.1109/CCECE.2019.8861532. (Year: 2019).*

(Continued)

*Primary Examiner* — Mohammad Ali
*Assistant Examiner* — Dhruvkumar Patel
(74) *Attorney, Agent, or Firm* — Armstrong Teasdale LLP

(57) ABSTRACT

A system for enhanced power system model validation is provided. The system includes a computing device including at least one processor in communication with at least one memory device. The at least one processor is programmed to store a plurality of models for a plurality of devices and a plurality of input files associated with the plurality of models, receive, from a user, a selection of model of the plurality of models to simulate, retrieve one or more input files of the plurality of input files, perform a model validity check on the selected model, if the selected model passed the (Continued)

model validity check, perform a model calibration on the selected model, and if the selected model passed the model calibration, perform a post evaluation on the selected model.

19 Claims, 19 Drawing Sheets

(56) References Cited

U.S. PATENT DOCUMENTS

| | | | |
|---|---|---|---|
| 9,557,723 | B2 | 1/2017 | Nasle |
| 9,645,558 | B2 | 5/2017 | Shokooh et al. |
| 9,778,629 | B2 * | 10/2017 | Venayagamoorthy ............ G05B 13/048 |
| 9,864,820 | B2 | 1/2018 | Shokooh et al. |
| 10,234,508 | B1 * | 3/2019 | Miao .................. G01R 31/343 |
| 10,371,740 | B2 | 8/2019 | Cui et al. |
| 2007/0055392 | A1 | 3/2007 | D'Amato et al. |
| 2010/0125347 | A1 | 5/2010 | Martin et al. |
| 2011/0251732 | A1 * | 10/2011 | Schweitzer, III . H02J 13/00034 700/297 |
| 2011/0282508 | A1 * | 11/2011 | Goutard .................. H02J 3/06 700/286 |
| 2012/0191439 | A1 | 7/2012 | Meagher et al. |
| 2015/0149128 | A1 | 5/2015 | Baone et al. |
| 2016/0246904 | A1 | 8/2016 | Meagher et al. |
| 2017/0373535 | A1 * | 12/2017 | Dam ................. H02J 13/00016 |
| 2018/0373824 | A1 | 12/2018 | Meagher et al. |
| 2019/0129367 | A1 | 5/2019 | Baone et al. |

FOREIGN PATENT DOCUMENTS

| | | |
|---|---|---|
| CN | 109119999 A | 1/2019 |
| CN | 106786671 B | 5/2019 |
| JP | 2012077617 A * | 4/2012 |
| KR | 101219545 B1 | 1/2013 |
| WO | 2018120893 A1 | 7/2018 |

OTHER PUBLICATIONS

Q. Y. Wang and J. X. Zong, "GENTPJ model dynamic performance," 2017 IEEE 30th Canadian Conference on Electrical and Computer Engineering (CCECE), 2017, pp. 1-4, doi: 10.1109/CCECE.2017.7946628. (Year: 2017).*

D. Kosterev, "Hydro turbine-governor model validation in pacific northwest," in IEEE Transactions on Power Systems, vol. 19, No. 2, pp. 1144-1149, May 2004, doi: 10.1109/TPWRS.2003.821464. (Year: 2004).*

Huang et al. "Generator Dynamic Model Validation and Parameter Calibration Using Phasor Measurements at the Point of Connection", IEEE Transactions on Power Systems, May 2013, pp. 1939-1949, vol. 28, Issue: 2.

Jiao et al. "Load Model Verification, Validation and Calibration Framework by Statistical Analysis on Field Data", International Journal of Emerging Electric Power Systems, Nov. 22, 2017, vol. 18, Issue: 6.

Allen et al., "Algorithm for Screening PMU Data for Power System Events", 2012 3rd IEEE PES Innovative Smart Grid Technologies Europe (ISGT Europe),Conference Location: Berlin, Germany,pp. 1-6, Oct. 14-17, 2012.

Conto et al., "Power system model validation", NERC White Paper, Dec. 2010.

Du, "Generator Dynamic Model Validation and Parameter Calibration using Phasor Measurements at the Point of Connection", 2014 IEEE PES General Meeting | Conference & Exposition, pp. 1-1, National Harbour, MD, USA, Jul. 27, 2014.

Hajnoroozi, A. et al., "Generating unit model validation and calibration through synchrophasor measurements," IEEE Transactions on Smart Grid 6, No. 1(2014):441-449.

Kristensen et al., "Methods for Similarity-based Virtual Screening", Comput Struct Biotechnol, vol. 05, Issue: 06, pp. 1-6, 2013.

Li et al., "Calibration of Dynamic Building Energy Models with Multiple Responses Using Bayesian Inference and Linear Regression Models", Energy Procedia, pp. 979-984, Nov. 2015.

Ma et al., "Use Multi-Dimensional Ellipsoid to Monitor Dynamic Behavior of Power Systems Based on PMU Measurement", 2008 IEEE Power and Energy Society General Meeting—Conversion and Delivery of Electrical Energy in the 21st Century, Pittsburgh, PA, USA, pp. 1-8, Jul. 20-24, 2008.

Prudhomme et al., "Adaptive Surrogate Modelling for Response Surface Approximations with Application to Bayesian Inference", Advanced Modelling and Simulation in Engineering Sciences, vol. 02, Issue No. 22, Sep. 17, 2015.

Willett., "Similarity-Based approaches to Virtual Screening", Biochem Soc Trans, pp. 603-606, Jun. 2003.

Xu et al., "Response-Surface-Based Bayesian Inference for Power System Dynamic Parameter Estimation", IEEE Transactions on Smart Grid, pp. 1-11, Jan. 2019.

Zarraga., "On-line Extraction of Modal Characteristics from Power System Measurements Based on Hilbert-Huang Analysis", 2009 6th International Conference on Electrical Engineering, Computing Science and Automatic Control (CCE), Conference Location: Toluca, Mexico, pp. 01-06, Jan. 10-13, 2009.

* cited by examiner

FIG. 14

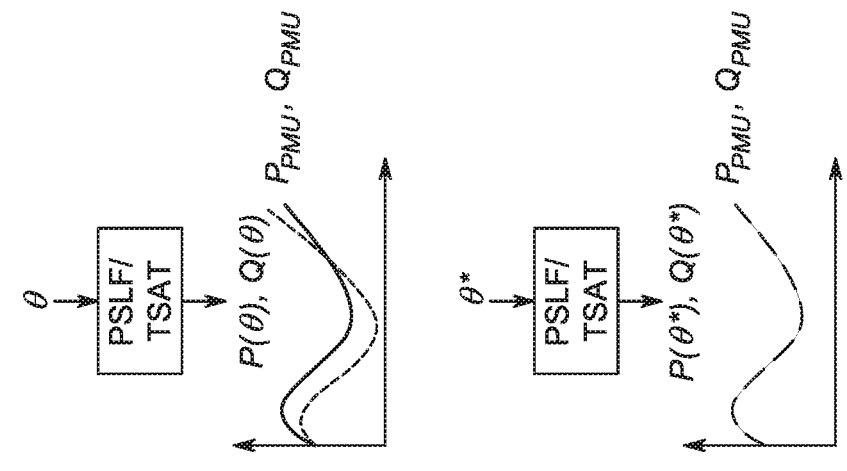

Model calibration algorithm

- Model: $y(\theta) = \begin{bmatrix} P(\theta) \\ Q(\theta) \end{bmatrix}$ Measurement: $y^m = \begin{bmatrix} P_{PMU} \\ Q_{PMU} \end{bmatrix}$, where, $P(\theta)$, $Q(\theta)$ are model outputs as a function of parameters $\theta$ $P_{PMU}$, $Q_{PMU}$ are time series PMU measurements

- Goal of model calibration: find $\theta^*$ such that model output matches measurements: $y(\theta^*) \approx y^m$

- Use a three-stage approach to solve this problem:
  Stage 1: Parameter identifiability analysis
  Stage 2: Parameter estimation
  Stage 3: Bayesian optimization

FIG. 15

SYSTEMS AND METHODS FOR ENHANCED POWER SYSTEM MODEL VALIDATION

CROSS REFERENCE TO RELATED APPLICATIONS

This application claims priority to and is a continuation-in-part of U.S. patent application Ser. No. 16/425,797, filed on May 29, 2019, entitled "SYSTEMS AND METHODS FOR ENHANCED POWER SYSTEM MODEL VALIDATION" which is hereby incorporated herein by reference in its entireties.

STATEMENT REGARDING FEDERALLY SPONSORED RESEARCH & DEVELOPMENT

This invention was made with government support under U.S. Government Contract Number: DE-OE0000858 awarded by the Department of Energy. The government has certain rights in the invention.

BACKGROUND

The field of the invention relates generally to enhanced power system model validation, and more particularly, to a system for validating and calibrating power system models.

During 1996 Western System Coordinating Council (WSCC) blackout, the planning studies conducted using dynamic models had predicted stable system operation, whereas the real system became unstable in a few minutes with severe swings. To ensure the models represent the real system accurately, North American Electric Reliability Coordinator (NERC) requires generators above 10 MVA to be tested every 5 years to check the accuracy of dynamic models and update the power plant dynamic models as necessary.

Some of the methods of performing validation and calibration on the model include performing staged tests and direct measurement of disturbances. In a staged test, a generator is first taken offline from normal operation. While the generator is offline, the testing equipment is connected to the generator and its controllers to perform a series of predesigned tests to derive the desired model parameters. This method may cost $15,000-$35,000 per generator per test in the United States and includes both the cost of performing the test and the cost of taking the generator off-line. Phasor Measurement Units (PMUs) and Digital Fault Recorders (DFRs) have seen dramatic increasing installation in recent years, which allows for non-invasive model validation by using the sub-second-resolution dynamic data. Varying types of disturbances across locations in the power system along with large installed base of PMUs makes it possible to validate the dynamic models of the generators frequently at different operating conditions.

Some Model Validation modules only provide playback simulation and response comparison for user to determine whether the model is "acceptable" or not. These modules do not include domain knowledge or intelligence and also do not include a means to verify if the model or parameter is valid or compliant to NERC standard or case study metrics. Some model calibration processes tune dozens of model parameters to match the simulation response with the field measurement. The quality of tuned model depends on a lot of factors including useful dynamic information in the disturbance, measurement data quality, observability related to PMU location, unmodeled dynamics, and the adopted calibration algorithm. Numerical curve fitting without adequate engineering guidance tends to provide overfitted parameter results, and non-unique set of parameters (leading to same curve fitting performance), which should be avoided. The reasonableness of the tuned parameters, parameter consistency at different disturbance, and even the resulting tuned system model's stability performance at different operating conditions have seldomly been evaluated in current practice. Thus far, the primary questions in the community have been: what parameters to calibration, and how to calibrate. Accordingly, there exists a need for to enhance the reliability and robustness of both the model validation and the model calibration.

BRIEF DESCRIPTION

In one aspect, a system for enhanced power system model validation is provided. The system includes a computing device including at least one processor in communication with at least one memory device. The at least one processor is programmed to store, in the at least one memory device, a plurality of models for a plurality of devices and a plurality of input files associated with the plurality of models. The at least one processor is also programmed to receive, from a user, a selection of a model of the plurality of models to simulate. The at least one processor is further programmed to retrieve, from the at least one memory device, one or more input files of the plurality of input files. In addition, the at least one processor is programmed to perform a model validity check on the selected model. If the selected model passed the model validity check, the at least one processor is programmed to perform a model calibration on the selected model. If the selected model passed the model calibration, the at least one processor is programmed to perform a post evaluation on the selected model.

In another aspect, a method for enhanced power system model validation is provided. The method is implemented on a computing device including at least one processor in communication with at least one memory device. The method includes storing, in the at least one memory device, a plurality of models for a plurality of devices and a plurality of input files associated with the plurality of models. The method also includes receiving, from a user, a selection of a model of the plurality of models to simulate. The method further includes retrieving, from the at least one memory device, one or more input files of the plurality of input files. In addition, the method includes performing a model validity check on the selected model. If the selected model passed the model validity check, the method includes performing a model calibration on the selected model. If the selected model passed the model calibration, the method includes performing a post evaluation on the selected model.

BRIEF DESCRIPTION OF THE DRAWINGS

The Figures described below depict various aspects of the systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals.

There are shown in the drawings arrangements which are presently discussed, it being understood, however, that the present embodiments are not limited to the precise arrangements and are instrumentalities shown, wherein:

FIG. 14 is an exemplary user interface for a post evaluation checklist in accordance with at least one embodiment.

FIG. 15 is a diagram illustrating a model calibration algorithm in accordance with some embodiments.

DETAILED DESCRIPTION

Figure 1:
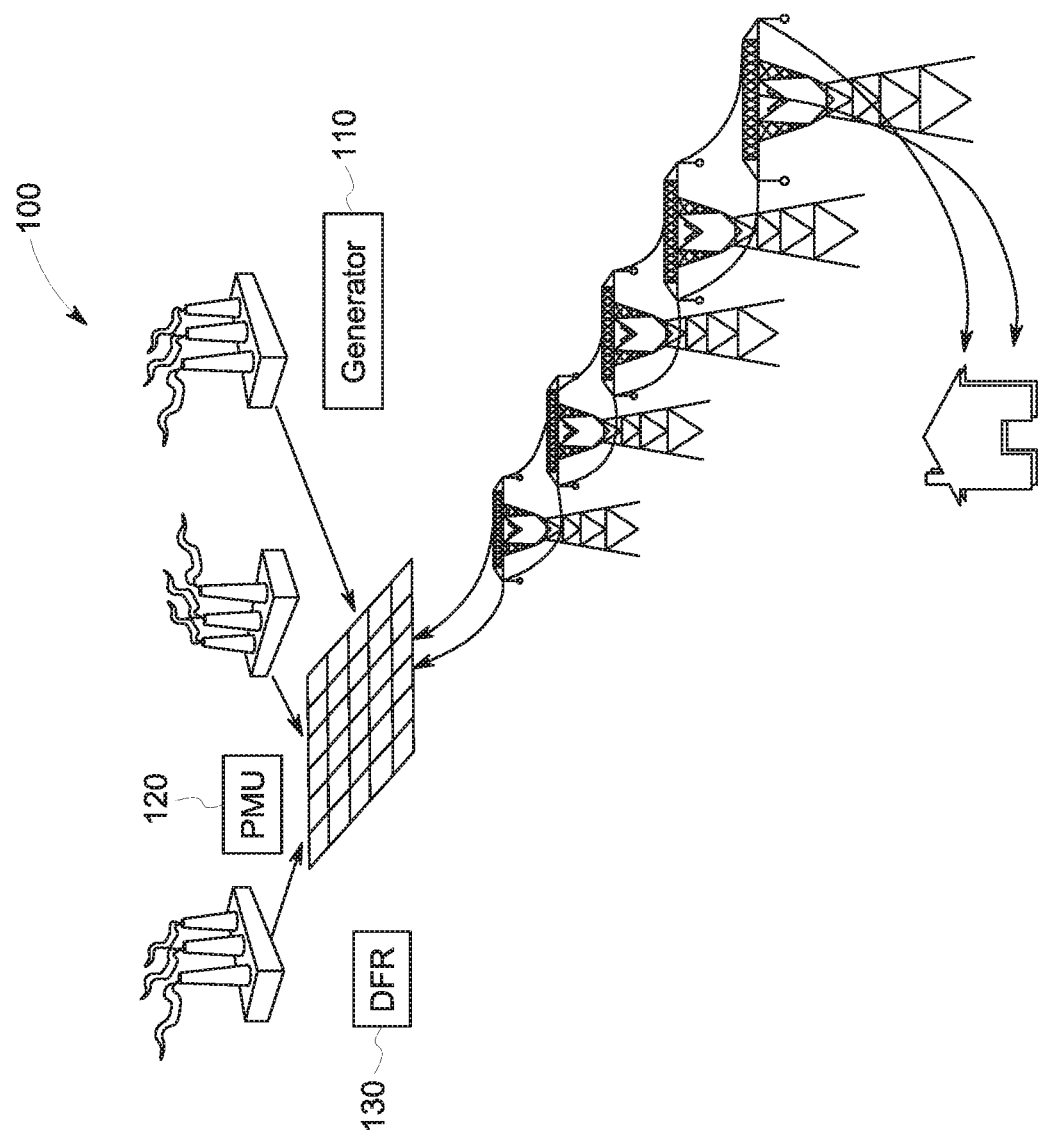
FIG. 1 illustrates a block diagram of a power distribution grid.

In the following detailed description, numerous specific details are set forth in order to provide a thorough understanding of embodiments. However, it will be understood by those of ordinary skill in the art that the embodiments may be practiced without these specific details. In other instances, well-known methods, procedures, components and circuits have not been described in detail so as not to obscure the embodiments.

One or more specific embodiments are described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power system models are the foundation for assessing Bulk Electric System (BES) reliability, including operating limits, system stability, and power transfer planning. NERC standards related to both steady-state and dynamic model validation (e.g., MOD-026-1, MOD-027-1, MOD-033-1) require planning entities to implement a validation process to periodically compare the model to actual system behavior. The wide spread deployment of high-speed measuring devices such as PMUs, capturing systems dynamics (grid disturbance) at a higher sampling rate (e.g. 60 to 120 Hz), makes it possible to frequently compare the response of system models with dynamics observed during disturbances in the system, which is called Model Validation. The grid disturbance can also be used to correct the system model when simulated response is significantly different from the measured values, which is called Model Calibration.

Typically a dynamic simulation engine is used to facilitate both identifiability of parameters (in total) and determination of parameters for calibration. Given field data with time stamped voltage (V) and frequency (f), the simulation engine will provide the simulated active power (P') and reactive (Q') with the same timestamp. Parameter identification involves multiple calls of simulation engines with parameter perturbation to determine the best choice of a subset of the parameters for tuning (calibration). Calibration involves multiple calls of the simulation engine to search for the best value for the given subset of parameters determined in the identifiability step.

The example embodiments provide a predictive model which can be used to replace the dynamic simulation engine when performing the parameter identification and the parameter calibration. This is described in U.S. patent application Ser. No. 15/794,769, filed 26 Oct. 2017, the contents of which are incorporated in their entirety. The model can be trained based on historical behavior of a dynamic simulation engine thereby learning patterns between inputs and outputs of the dynamic simulation engine. The model can emulate the functionality performed by the dynamic simulation engine without having to perform numerous rounds of simulation. Instead, the model can predict (e.g., via a neural network, or the like) a subset of parameters for model calibration and also predict/estimate optimal parameter values for the subset of parameters in association with a power system model that is being calibrated. According to the examples herein, the model may be used to capture both input-output function and first derivative of a dynamic simulation engine used for model calibration. The model may be updated based on its confidence level and prediction deviation against the original simulation engine.

Here, the model may be a surrogate for a dynamic simulation engine and may be used to perform model calibration without using DAE equations. The system described herein may be a model parameter tuning engine, which is configured to receive the power system data and model calibration command, and search for the optimal model parameters using the surrogate model until the closeness between simulated response and the real response from the power system data meet a predefined threshold. In the embodiments described herein, the model operates on disturbance event data that includes one or more of device terminal real power, reactive power, voltage magnitude, and phase angle data. The model calibration may be triggered by user or by automatic model validation step. In some aspects, the model may be trained offline when there is no grid event calibration task. The model may represent a set of different models used for different kinds of events. In some embodiments, the model's input may include at least one of voltage, frequency and other model tunable parameters. The model may be a neural network model, fuzzy logic, a polynomial function, and the like. Other model tunable parameters may include a parameter affecting dynamic behavior of machine, exciter, stabilizer and governor. Also, the surrogate model's output may include active power, reactive power or both. In some cases, the optimizer may be gradient based method including Newton-like methods. For example, the optimizer may be gradient free method including pattern search, genetic algorithm, simulated annealing, particle swarm optimizer, differential evolution, and the like.

Some preconditioning work including parameter bounds, removal of insignificant model or parameter before the parameter estimation can improve the quality of the calibration result. However, system level issues caused by interaction between submodules and even interaction between generator and grid, can only be exposed by systematic evaluation using all calibrated models and parameters. Without a systematic post evaluation, it is difficult and sometimes dangerous for the grid planner and grid operator to adopt the calibrated model for various study.

Taking a generator for example, a typical power plant model has four parts: machine model, turbine-governor model, excitation model and power system stabilizer (PSS) model. The machine model represents the system physical characteristic, the turbine-governor model relates more to the frequency/active power response while excitation and PSS model relate more to voltage/reactive power response. Static excitation systems with high-gain and fast-response times greatly aid transient stability (synchronizing torque), but at the same time tend to reduce small signal stability (damping torque). The PSS is used to supply positive damping torque to offset the negative contribution of the excitation regulation system, resulting in a compensated system that adds damping and enhances small signal stability. Therefore, the PSS model parameter tuned at one condition (using curve fitting to measured disturbance) may not have adequate stability margin to make system stable at another condition. The same situation also applies to Governor model tuning.

The systems and methods disclosed herein describe enhanced model validation and calibration based on the incorporation of NERC List of Valid Models, NERC case study metrics, stability evaluation, governor mode evaluation, Western Electricity Coordinating Council (WECC) and Eastern Interconnection parameter bounds and dynamic feature matching in response. The enhanced model validation and calibration described herein is configured to make the generator model and parameters compliant to relevant NERC standards and notifications, ensure the calibrated control system stability at reasonable operating range, and allow better match on control dynamics.

The systems and methods described herein describe a novel model validation and calibration framework including model validation, model calibration, and post evaluation. Model validation includes a model validity check, a parameter validity check, and a governor mode check, in addition to the playback simulation and response match evaluation. Model calibration includes analysis of dynamic features (phase shift, amplitude and damping ratio) in the objective functions and parameter value reasonable constraints. Post evaluation includes another layer of check on model, parameter, response, and control stability check. In the exemplary embodiment, the corresponding adaptive parameter or bounds adjustment is designed at the end of the post evaluation to allow for the post evaluation results to readjust the iteration with model calibration.

FIG. 1 illustrates a power distribution grid 100. The grid 100 includes a number of components, such as power generators 110. In some cases, planning studies conducted using dynamic models predict stable grid 100 operation, but the actual grid 100 may become unstable in a few minutes with severe swings (resulting in a massive blackout). To ensure that the models represent the real system accurately, the North American Electric Reliability Coordinator ("NERC") requires generators 110 above 10 MVA to be tested every five years to check the accuracy of dynamic models and let the power plant dynamic models be updated as necessary. The systems described herein consider not only active power (P) and reactive power (Q) but also voltage (V) and frequency (F).

In a typical staged test, a generator 110 is first taken offline from normal operation. While the generator 110 is offline, testing equipment is connected to the generator 110 and its controllers to perform a series of pre-designed tests to derive the desired model parameters. Recently, PMUs 120 and Digital Fault Recorders ("DFRs") 130 have seen dramatic increasing installation in recent years, which may allow for non-invasive model validation by using the sub-second-resolution dynamic data. Varying types of disturbances across locations in the grid 100 along with the large installed base of PMUs 120 may, according to some embodiments, make it possible to validate the dynamic models of the generators 110 frequently at different operating conditions. There is a need for a production-grade software tool generic enough to be applicable to wide variety of models (traditional generating plant, wind, solar, dynamic load, etc.) with minimal changes to existing simulation engines. Note that model calibration is a process that seek multiple (dozens or hundreds) of model parameters, which could suffer from local minimum and multiple solutions. There is need for an algorithm to enhance the quality of a solution within a reasonable amount time and computation burdens.

Online performance monitoring of power plants using synchrophasor data or other high-resolution disturbance monitoring data acts as a recurring test to ensure that the modeled response to system events matches actual response of the power plant or generating unit. From the Generator Owner (GO)'s perspective, online verification using high resolution measurement data can provide evidence of compliance by demonstrating the validity of the model by online measurement. Therefore, it is a cost-effective approach for GO as they may not have to take the unit offline for testing of model parameters. Online performance monitoring requires that disturbance monitoring equipment such as a PMU be located at the terminals of an individual generator or Point of Interconnection (POI) of a power plant. FIG. 2B provides a high-level illustration of this approach.

The disturbance recorded by PMU normally consists of four variables: voltage, frequency, active power and reactive power. To use the PMU data for model validation, the play in or playback simulation has been developed and they are now available in all major grid simulators. FIG. 2C shows the measured voltage and frequency are commonly used as playback input. The simulated output including active power and reactive power will be generated and can be further compared with the measured active power and reactive power.

Figure 2A:
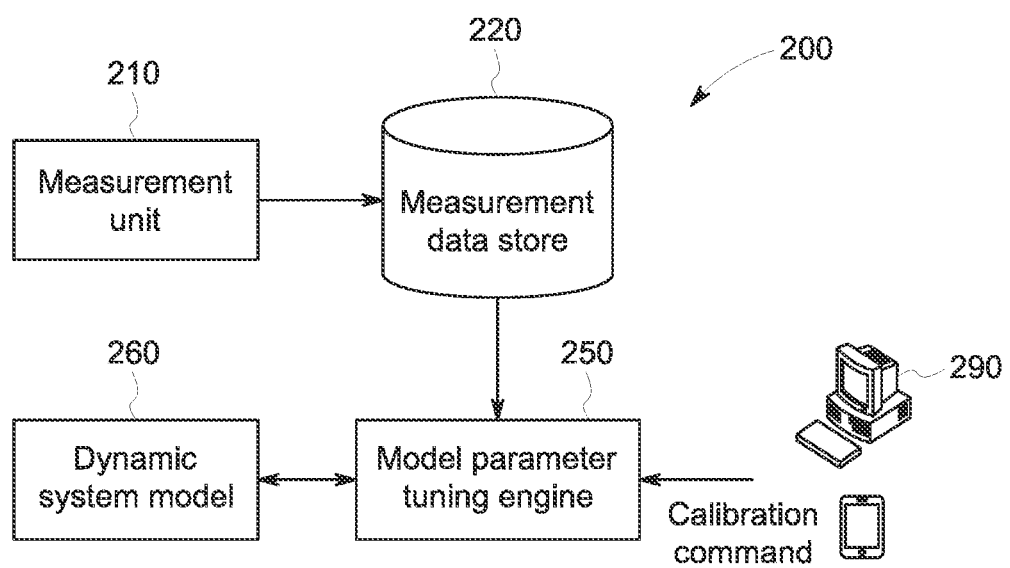
FIG. 2A illustrates a high-level block diagram of a system for performing sequential calibration in accordance with some embodiments.
Figure 2B:
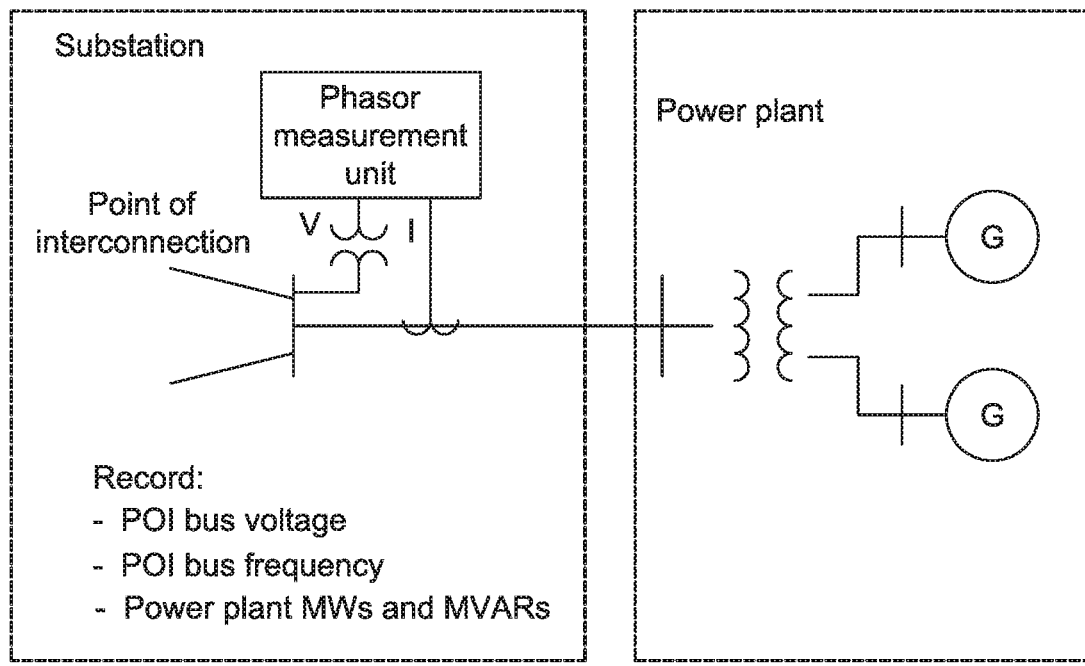
FIG. 2B illustrates a block diagram of a PMU-based disturbance monitoring system in accordance with one embodiment of the disclosure.
Figure 2C:
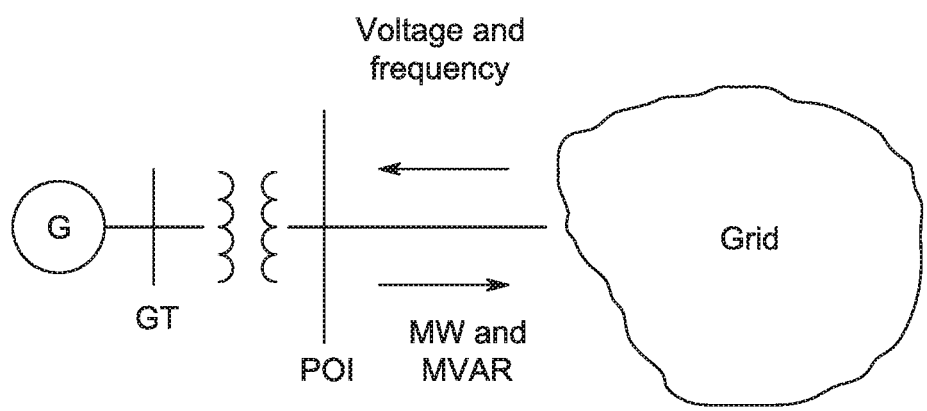
FIG. 2C illustrates a block diagram of a playback simulation system in accordance with one embodiment of the disclosure.

To achieve such results, FIG. 2A is a high-level block diagram of a system 200 in accordance with some embodiments. The system 200 includes one or more measurement units 210 (e.g., PMUs, DFRs, or other devices to measure frequency, voltage, current, or power phasors) that store information into a measurement data store 220. As used herein, the term "PMU" might refer to, for example, a device used to estimate the magnitude and phase angle of an electrical phasor quantity like voltage or current in an electricity grid using a common time source for synchronization. The term "DFR" might refer to, for example, an Intelligent Electronic Device ("IED") that can be installed in a remote location, and acts as a termination point for field contacts. According to some embodiments, the measurement data might be associated with disturbance event data and/or data from deliberately performed unit tests. According to some embodiments, a model parameter tuning engine 250 may access this data and use it to tune parameters for a dynamic system model 260. The process might be performed automatically or be initiated via a calibration command from a remote operator interface device 290. As used herein, the term "automatically" may refer to, for example, actions that can be performed with little or no human intervention.

Note that power systems may be designed and operated using mathematical models (power system models) that characterize the expected behavior of power plants, grid elements, and the grid as a whole. These models support decisions about what types of equipment to invest in, where to put it, and how to use it in second-to-second, minute-to-minute, hourly, daily, and long-term operations. When a generator, load, or other element of the system does not act in the way that its model predicts, the mismatch between reality and model-based expectations can degrade reliability and efficiency. Inaccurate models have contributed to a number of major North American power outages.

The behavior of power plants and electric grids may change over time and should be checked and updated to assure that they remain accurate. Engineers use the processes of validation and calibration to make sure that a model can accurately predict the behavior of the modeled object. Validation assures that the model accurately represents the operation of the real system—including model structure, correct assumptions, and that the output matches actual events. Once the model is validated, a calibration process may be used to make minor adjustments to the model and its parameters so that the model continues to provide accurate outputs. High-speed, time-synchronized data, collected using PMUs may facilitate model validation of the dynamic response to grid events. Grid operators may use, for example, PMU data recorded during normal plant operations and grid events to validate grid and power plant models quickly and at lower cost.

The transmission operators or Regional reliability coordinators, or Independent System Operators, like MISO, ISO-New England, PG&E, can use this calibrated generator or power system model for power system stability study based on N-k contingencies, in every 5 to 10 minutes. If there is stability issue (transient stability) for some specific contingency, the power flow will be redirected to relieve the stress-limiting factors. For example, the output of some power generators will be adjusted to redirect the power flow. Alternatively, adding more capacity (more power lines) to the existing system can be used to increase the transmission capacity.

With a model that accurately reflects oscillations and their causes, the grid operator can also diagnose the causes of operating events, such as wind-driven oscillations, and identify appropriate corrective measures before those oscillations spread to harm other assets or cause a loss of load.

As used herein, devices, including those associated with the system 200 and any other device described herein, may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol ("WAP") network, a Bluetooth network, a wireless LAN network, and/or an Internet Protocol ("IP") network such as the Internet, an intranet, or an extranet. Note that any devices described herein may communicate via one or more such communication networks.

The model parameter tuning engine 250 may store information into and/or retrieve information from various data stores, which may be locally stored or reside remote from the model parameter tuning engine 250. Although a single model parameter tuning engine 250 is shown in FIG. 2A, any number of such devices may be included. Moreover, various devices described herein might be combined according to embodiments of the present invention. For example, in some embodiments, the measurement data store 220 and the model parameter tuning engine 250 might comprise a single apparatus. The system 200 functions may be performed by a constellation of networked apparatuses, such as in a distributed processing or cloud-based architecture.

A user may access the system 200 via the device 290 (e.g., a Personal Computer ("PC"), tablet, or smartphone) to view information about and/or manage operational information in accordance with any of the embodiments described herein. In some cases, an interactive graphical user interface display may let an operator or administrator define and/or adjust certain parameters (e.g., when a new electrical power grid component is calibrated) and/or provide or receive automatically generated recommendations or results from the system 200.

Figure 3:
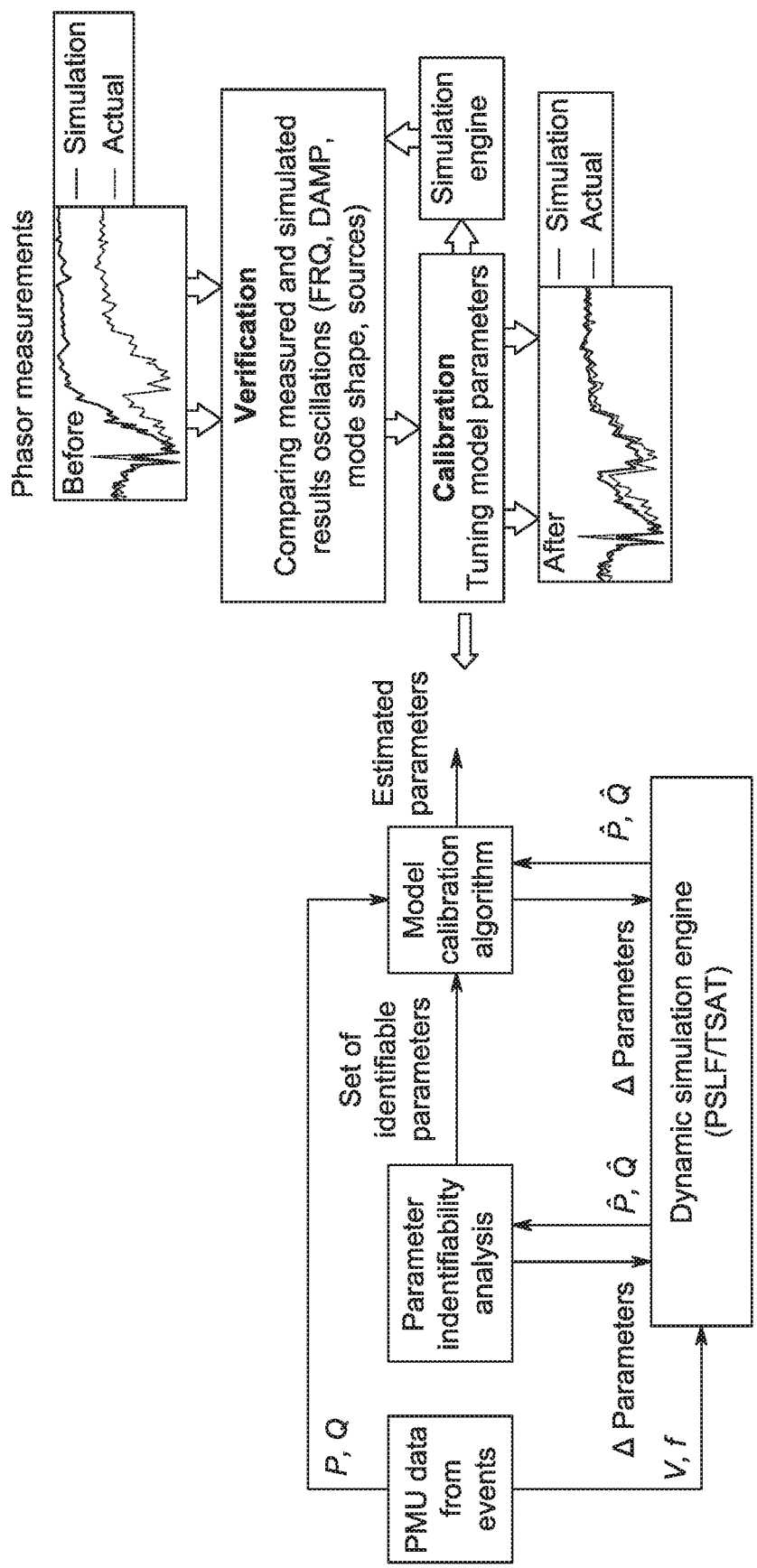
FIG. 3 illustrates a two-stage approach of the process for model calibration.

FIG. 3 illustrates a two-stage approach of the process for model calibration. In this approach, PMU data from events is fed into a dynamic simulation engine. The dynamic simulation engine communicates with a parameter identifiability analysis component and returns the changes to the parameters. The parameter identifiability analysis component also transmits a set of identifiable parameters to a model calibration algorithm component. The model calibration algorithm component uses the set of identifiable parameters, PMU data from events, and other data from the dynamic simulation engine to generate estimated parameters. This approach may be used to calibrate the tuning model parameters.

With the playback simulation capability, the user can compare the response (active power and reactive power) of system models with dynamics observed during disturbances in the system, which is called model validation. The grid disturbance can also be used to correct the system model when simulated response is significantly different from the measured values, which is called model calibration. As shown in right side of the FIG. 3, the goal is to achieve a satisfactory match between the measurement data and simulated response. If obvious discrepancy is observed, then the model calibration will be employed.

The first step of the model calibration is parameter identification, which aims to identify a subset of parameters with strong sensitivity to the observed event. Given the list of parameters ranked by their tunability, users will have a choice to choose only the subset of parameters to calibrate. Users will also be able to specify a tunable range between a min and max value. The second step is to tune the identified parameter subset using parameter estimation method. The nonlinear optimization algorithm together with the unscented Kalman filter algorithm has been both developed for parameter estimation of power system dynamic models. Based on evaluation against synthetic event data provided by NERC-/NASPI and field event data, the nonlinear least square optimization approach may be down-selected for use.

In the exemplary embodiment, the model calibration process requires a balance on matching in measurement space and reasonableness in the model parameter space. Numerical curve fitting without adequate engineering guidance tends to provide overfitted parameter result, and non-unique set of parameters (leading to same curve fitting performance), which should be avoided. The reasonableness of the tuned parameters, parameter consistency at different disturbance, and even the resulting tuned system model's stability performance at different operating condition will be evaluated during the post evaluation step.

Figure 4:
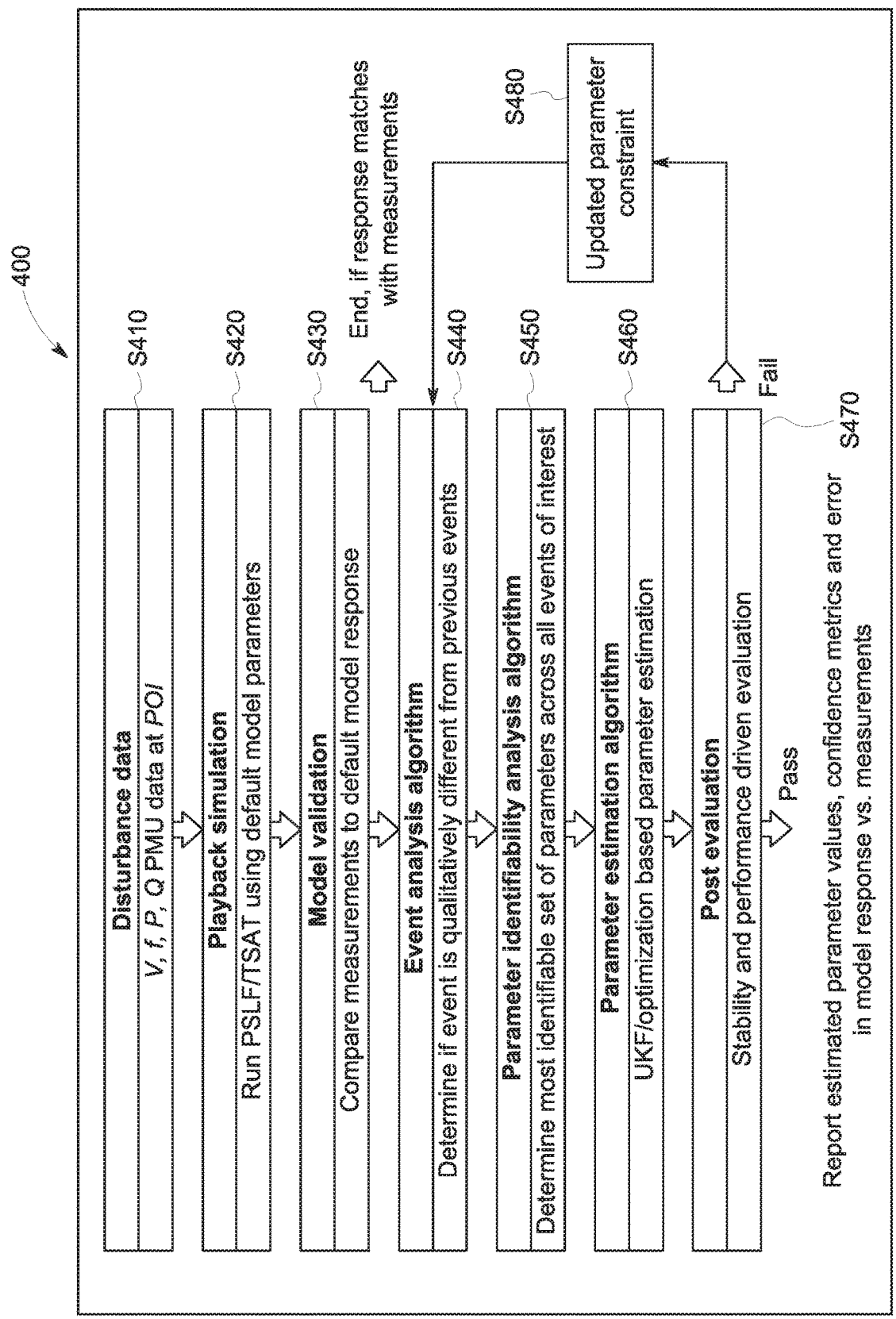
FIG. 4 illustrates an exemplary general framework 400 for power system model parameter conditioning according to some embodiments.

FIG. 4 illustrates an exemplary general framework 400 for power system model parameter conditioning according to some embodiments.

Framework 400 provides one example where the post evaluation S470 starts right after parameter estimation S460. At S410, disturbance data may be obtained (e.g., from a PMU or DFR) to obtain, for example, V, f, P, and Q measurement data at a Point Of Interest ("POI"). At S420, a playback simulation may run load model benchmarking using default model parameters (e.g., associated with a Positive Sequence Load Flow ("PSLF") or Transient Security Assessment Tool ("TSAT")). At S430, model validation may compare measurements to default model response. If the response matches the measurements, the framework may end (e.g., the existing model is sufficiently correct and does not need to be updated). At S440, an event analysis algorithm may determine if event is qualitatively different from previous events. At S450, a parameter identifiability analysis algorithm may determine most identifiable set of parameters across all events of interest.

If the calibrated model does not pass the post evaluation step S470, then the parameter constraint will be updated automatically S480 and trigger another model validation and calibration cycle. Once the calibrated model passes the post evaluation S470, the calibrated results including the evaluation performance index value, updated parameter and curves will be documented for future retrieval. As a result, the estimated parameter values, confidence metrics, and error in model response (compared to measurements) may be reported.

Alternatively, the reasonableness check can also be located at the model validation step S430 to provide more informed constraints and guidance, such as dynamic model validity check. The reasonableness check can also facilitate parameter identifiability by exerting stringiest parameter constraints. Another example is to put the reasonableness check inside of the parameter estimation algorithm, wherein the reasonableness check as the optimization constraint can control the feasible solution space.

Events are where the voltage and/or the frequency of the power system changes. For each event, the event screening component determines whether the event is novel enough. For example, an event may be a generator turning on. If the event has the same or similar attributes to a previous event, such as that same generator turning on, then the event screening component skips this event. In the exemplary embodiment, the event screening component compares the event to those events stored in a database. If the event is novel enough, then the event is stored in the database. Then the event is sent to the parameter identifiability component. This component analyzes the event in combination with past events and the parameters identified as significant with those events to determine which parameters ae significant for this event. Then the tunable parameters are transmitted to the Bayesian Optimization component, which further analyzes the significant parameters to calibrate the parameters in the model being executed by the simulation engine.

Disturbance data may be monitored by one or more PMUs coupled to an electrical power distribution grid may be received. The disturbance data can include voltage ("V"), frequency ("f"), and/or active and nonactive reactive ("P" and "Q") power measurements from one or more points of interest (POI) on the electrical power grid. A power system model comprises model structure (or model type) and parameters. The model parameters reflect the current power system or asset that is normally stored in the model record. The model record file can be a GE file (DYD), a PTI file (DYR), a BPA file (SWI), an a PowerWorld Auxiliary file (AUX). Model calibration involves identifying a subset of parameters that can be "tuned" and modifying/adjusting the parameters such that the power system model behaves identically or almost identically to the actual power component being represented by the power system model.

In accordance with some embodiments, the model calibration can implement model calibration with three functionalities. The first functionality is an event screening tool to select characteristics of a disturbance event from a library of recorded event data. This functionality can simulate the power system responses when the power system is subjected to different disturbances. The second functionality is a parameter identifiability study. When implementing this functionality, the can simulate the response(s) of a power system model. The third functionality is simultaneous tuning of models using event data to adjust the identified model parameters. According to various embodiments, the second functionality (parameter identifiability) and the third functionality (tuning of model parameters) may be done using a surrogate model in place of a dynamic simulation engine.

Instead of using the time consuming simulation engine, the surrogate model or models (such as Neural Networks) with equivalent function of dynamic simulation engine, may be used for both identifiability and calibration. The surrogate model may be built offline while there is no request for model calibration. Once built, the surrogate model comprising a set of weights and bias in learned structure of network will be used to predict the active power ($\hat{P}$) and reactive ($\hat{Q}$) given different set of parameters together with time stamped voltage (V) and frequency (f).

The parameter identifiability analysis addresses two aspects: (a) magnitude of sensitivity of output to parameter change; and (b) dependencies among different parameter sensitivities. For example, if the sensitivity magnitude of a particular parameter is low, the parameter would appear in a row being close to zero in the parameter estimation problem's Jacobian matrix. Also, if some of the parameter sensitivities have dependencies, it reflects that there is a linear dependence among the corresponding rows of the Jacobian. Both these scenarios lead to singularity of the Jacobian matrix, making the estimation problem infeasible. Therefore, it may be important to select a subset of parameters which are highly sensitive as well as result in no dependencies among parameter sensitivities. Once the subset of parameters is identified, values in the active power system model for the parameters may be updated, and the system may generate a report and/or display of the estimated parameter values(s), confidence metrics, and the model error response as compared to measured data.

Figure 5:
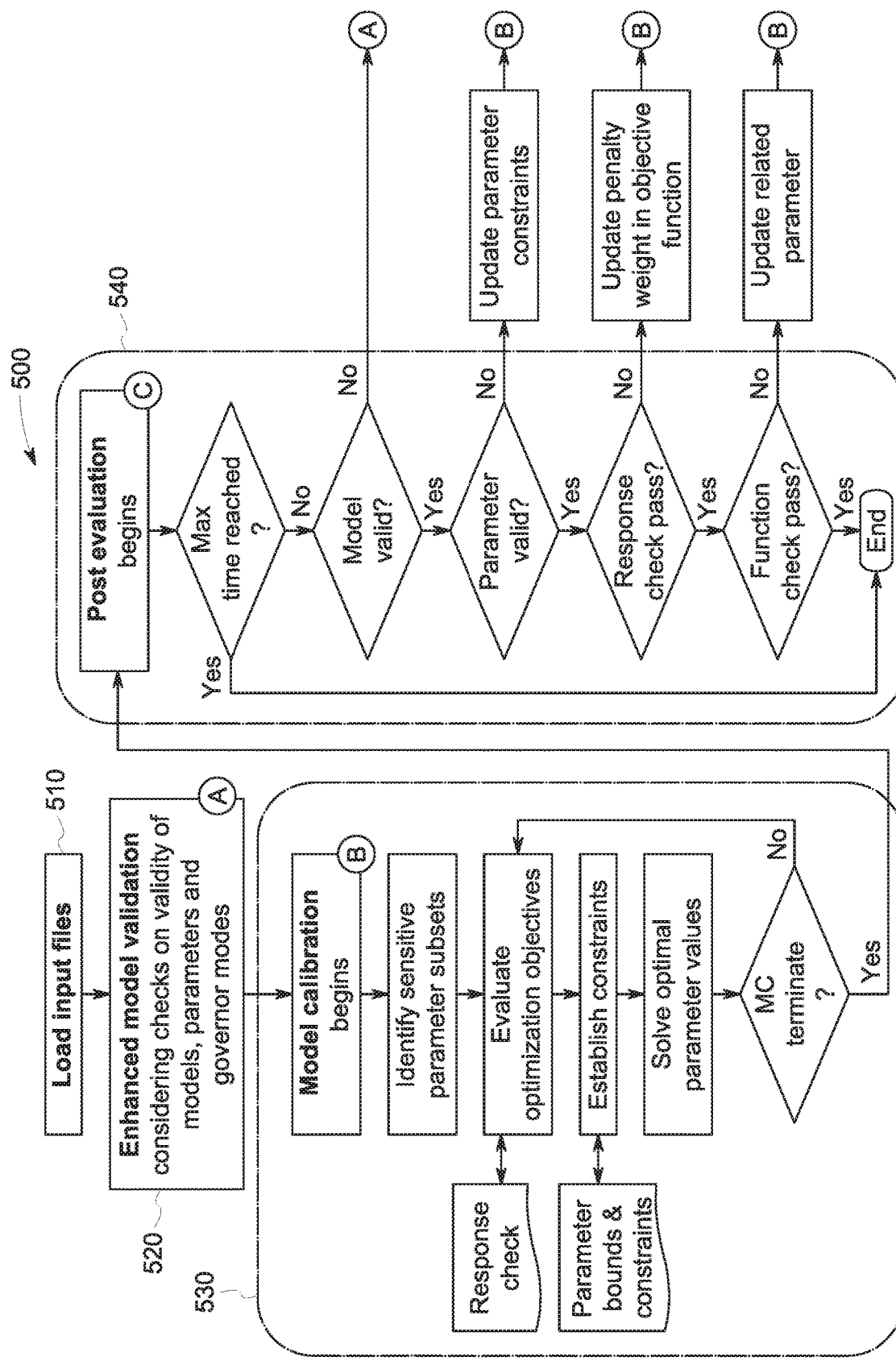
FIG. 5 illustrates a flow chart of an exemplary process for model validation and calibration including reasonableness checks, in accordance with one embodiment of the disclosure.

FIG. 5 illustrates a flow chart of an exemplary process 500 for model validation and calibration including reasonableness checks, in accordance with one embodiment of the disclosure. Process 500 contains four major blocks: data ingestion 510, enhanced model validation 520 (Block A), enhanced model calibration 530 (Block B), and post evaluation 540 (Block C).

The data flow starts from input data file ingestion 510 including event data file, generator dynamic model file, generator's network file (netmom) and subsystem definition. The enhanced model validation 520 is conducted after the data ingestions 510. The enhanced model validation 520 incorporates model validity check, NERC case study metric related parameter check and governor mode evaluation, which are described further in FIGS. 6 and 7.

The core of the current model calibration 530 is a Non-linear Least Square (NLS) Optimization without specifying parameter bounds. In the enhanced model calibration, the Parameter Check is added as constraints; while the Response Match is added as part of objective functions as described further below.

After completing the model calibration 530, the post evaluation 540 automatically evaluates all four-reasonableness checks. In process 500, this is the last defense layer to safeguard the model meeting the predefined requirements. If the model does not pass the validity check, the code will go back to model validation 520 (Block A) to re-verify. If the model does not pass the parameter check, then the corresponding constraints for the out-of-spec parameters will be updated and go back to model calibration 530 (Block B). If the response check fails, then the corresponding penalty weight for that specific response feature will be increased. If the function check fails, depending on which model or function fails, the corresponding parameter affecting that model or function will be updated before restarting the model calibration.

Process 500 describes one potential solution. In other embodiments, the process may be adjusted depending on the balance between calculation speed and quality of solution. Accordingly, there can be multiple solutions to integrate the proposed four validity checks into the existing framework.

In the exemplary embodiment, there are four reasonableness checks performed as a part of process 500. In some embodiments, the reasonableness checks are performed to exert the necessary domain knowledge on the calibrated model to allow the use of any curve fitting method.

The first check is the model check, where the currently used dynamic model is automatically checked against the NERC Approved Dynamic Model List (or NERC Model Notification). The second check is the parameter check. The key parameter value and relative relationship between parameters is automatically evaluated against the NERC Case Quality Dynamic Metrics. The other parameter values not covered in the NERC Case Quality Dynamic Metrics may also be automatically evaluated against the parameter bounds in the dynamic model files (dyd or dyr file) from WECC and Eastern Interconnect. In some embodiments, the parameter bounds in the dynamic model files (dyd or dyr file) from ERCOT and Quebec may also be added. The third check is the response check. In this check, the simulated response using the calibrated model is compared with the measurement response using engineering acceptable and applicable metrics, including but not limited to, phase shift, amplitude, and damping ratios. The fourth check is the function check. In this check, the key control functions in the calibrated model including PSS, AVR, and Governor are evaluated using various simulation tests, including gain margin test, stability evaluation at various conditions, exciter step test with PSS on and off, and speed step test.

Model Check

In regards to the model check, a typical synchronous generator model has four parts: machine model, turbine-governor model, excitation model and power system stabilizer (PSS) model. The model check is based on a collection of published NERC List of Acceptable Models, user preferences, and historical data. In some embodiments, there may also be prohibited model lists that are evaluated. Furthermore, in the exemplary embodiment, units with a power system stabilizer (PSS) should have an excitation system model.

As a first embodiment, the machine model may be updated to GENTPJ based on NERC Notification. Entities using the GENSAL or GENROU model are advised to consider using the GENTPJ model for new generators and where generator data is to be newly (re)verified. GENROU, GENSAL, GENTPF, and GENTPJ models represent round rotor and salient pole synchronous machines. Predominant difference between GENSAL/GENROU and GENTPF/GENTPJ models is how they account for saturation. GENTPJ model recognizes the effect of stator current by including additional parameter, Kis, in the saturation function. Generator testing in connection with MOD-026 has proved that GENSAL, GENROU, and GENTPF may underestimate field current needed to support rated reactive power output and could introduce errors for simulations studying reactive power support.

As another embodiment, Excitation model such as EX2000 model in Siemens PSS/E shall be replaced with AC7B in PSSE and ex21br in PSLF.

As the third embodiment, GE Excitation system with different version of GE Control system may have different recommended model. For example, GE EX2100e with Mark VIe control system should use esst4b model.

Prohibited Machine model list may comprise of GENSAL, GENSAE, GENCLS, CGEN1, GENTRA, FRECHG, all of which is well known model names in the commercial software PSLF or PSS/E.

Parameter Check

In the parameter check, the key parameter values and relative relationship between parameters is evaluated against the NERC Case Quality Dynamic Metrics. Below are several parameters that may be evaluated in the exemplary embodiment.

First, consistent generator reactance may be evaluated, where D-axis synchronous reactance (Xd) should not be less than d-axis transient reactance (Xd'), D-axis transient reactance (Xd') should not be less than d-axis subtransient reactance (Xd"), subtransient reactance (Xd") should not be less than stator leakage reactance (Xl), Q-axis synchronous reactance (Xq) should not be less than q-axis transient reactance (Xq'), and Q-axis transient reactance (Xq') should not be less than q-axis subtransient reactance (Xq").

Consistent time constants are analyzed where Tppd0≤Tpd0 and Tppq0≤Tpq0 and Tpq0≤Tpd0. In some cases, there are exceptions where, the only check used is Tppd0≤Tpd0. For Reasonable Initial constants, the evaluation is 1.5≤H≤9.0. When evaluating the Reasonable Saturation Factors, the following checks may be made: 0.03≤(1.0)≤0.18 and 0.2≤S(1.2)≤0.85, where S(1.2) should be within 2 to 8 times S(1.0). For a severe saturation factor check: S(1.0) and S(1.2) should be greater than zero, S(1.0) and S(1.2) should be less than 1.0, and S(1.0) should be less than or equal to S(1.2). In at least one embodiment, speed damping should be zero. Generator speed damping coefficient should be equal to 0 for non-classical machine models. When evaluating Consistent Lead-Lag Time Constants, Turbine-governor models should have lead-time constants less than lag time constants. This may stabilize the model as it reduces the forward path gain for high frequency changes in the input. When evaluating Power Development Fractions, the turbine power development fractions should add to 1.0. For DC Exciter Self-Excitation, the DC exciter model self-excitation parameter KE should be a small negative number unless KE=0 (automatically calculated by program) or KE=1 (separately excited exciter).

In addition, there are other parameter values that are not covered in the NERC Case Quality Dynamic Metrics but may be automatically evaluated against the parameter bounds in the dynamic model files (dyd or dyr file) from WECC and Eastern Interconnect (ERCOT and Quebec can be added if available). The other parameters not defined above should be with the bounds summarized from dynamic model files (dyd or dyr file) from WECC and Eastern Interconnect (ERCOT and Quebec can be added if available).

The third category of parameter constraint is from the simulation engine. This may include the minimum bound of 1 cycle (i.e. 1/60 s) for machine's time constant used because default integration time step in most positive sequence tools is ¼ cycle and for numerical stability smaller time constants can be problematic. The maximum bound of 90 second for machine's time constant may be used because generally most positive sequence studies are conducted for about 30-60 s, so dynamics that are slower with larger time constants are typically not modeled in such studies.

The parameter constraints, which are primarily high low bounds and inequality constraints, can be saved in a database file. Then a script can be made to check each parameter value against the database file. The Parameter Check module could be part of model validation 520, model calibration 530, and post evaluation 540 after the model calibration 530.

Response Check

For the response check, the simulated response using the calibrated model is compared with the measurement response using engineering acceptable and applicable metrics, including but not limited to phase shift, amplitude, and damping ratio.

The response check ensures that the model accurately captures phase shift, as defined by the model time constants, such that oscillation phase should align between measurement and model. The response check also ensures that the amplitude of the modeled response accurately matches the measured data. Differences in amplitudes are generally attributed to controller gains, droop settings, or action of a load controller. The response check further ensures that the model accurately captures the oscillation ringdown and damping ratio for active and reactive power output. This includes capturing any growing or relatively undamped oscillatory modes throughout the playback time duration.

With predefined formula or approach to calculate phase shift, amplitude and damping ratio, the response check may be performed using the extracted simulated metric and comparing with the measured metric. In some embodiments, if the response check is a part of the post evaluation 540, a user defined threshold for each index can be used to determine if the calibrated model's response curve pass or fail this check. If the relative error between simulated metric and measured metric goes below the predefined threshold, then the model's response curve is determined as Pass; otherwise, it is Fail. In some embodiments, the threshold is based on engineering judgement (subject matter experts) as it could be case by case. This threshold value may be provided in the user interface for user to adjust. A default value could set at 10% (relative error).

Another method to deploy the response check is to use it as one part of optimization objective function during model calibration 530. The by-default non-linear least square optimization uses the below objective function:

$$\min E = w_o * \|O_s^2 - O_m^2\|_2 \quad \text{EQ. 1}$$

Where O represents the response output variables, including active power and reactive power; $O_s$ represents the simulated time series; Om represents the measured time series; $w_o$ represents relative weight for each response output residual term.

By considering the three new response check metrics, including phase shift, amplitude and damping ratio, the new objective function will be:

$$\min E = w_o * \|O_s^2 - O_m^2\|_2 + w_{ps} * \|PS_s^2 - PS_m^2\|_2 + w_a * \|A_s^2 - A_m^2\|_2 + w_d * \|D_s^2 - D_m^2\|_2 \quad \text{EQ. 2}$$

The three newly added terms represent additional penalty for any deviation of phase shift, amplitude and damping ratio. In this way, the response constraints can be respected during model calibration optimization step.

Function Check

The function check includes key control functions in the calibrated model including PSS, AVR, and Governor which are evaluated using various simulation tests, including instability gain margin test, stability evaluation at various conditions, exciter step test with PSS on and off, and speed step test. The aim is to ensure reactive power, damping, and active power control functions including setpoint tracking, disturbance rejection and stability are fully evaluated.

The first check is the Instability Gain Margin Test. Depending on the system configurations, relative size of the unit with respect to the local grid, and transmission characteristics, the instability point of the PSS varies. To find the point of instability, it is necessary to operate the exciter with the PSS active and gradually increase the gain of the PSS to determine what gain causes PSS instability. Testing is done up to a gain of four times the nominal recommended gain. In some embodiments, a minimum gain margin of 10 db, which is a factor of three times the nominal set gain is used. If an instability gain is encountered, the final gain should be not more than ⅓ of the instability gain. In the exemplary embodiment all PSS testing is performed at 80% load or higher and close to unity power (0 MVars). During the simulation test, the emulated grid should cover strong, medium, and weak situations, such as by setting the grid impedance at values of 0.02 pu to 0.2 pu.

The next check is the Exciter Step Test. The Exciter is stepped with PSS disabled. For example, step up (2%) AVR regulator for 10 sec, and then step down (2%) AVR regulator for 10 sec. Record the PSS output, generator active power and reactive power, terminal voltage and field voltage. Then, step the Exciter with PSS enabled. A marked difference (decrease) in the number and amplitude of oscillations in the power (MW) variable indicates the effectiveness of PSS.

Another check is the Exciter Impulse Test. The Exciter is stepped with PSS disabled. For example, step up (5%) AVR regulator for 0.1 sec and wait for 10 sec or until the variables reach steady state, and then step down (5%) AVR regulator for 0.1 sec and wait for 10 sec or until the variables reach steady state. Record the PSS output, generator active power and reactive power, terminal voltage and field voltage. Then, step the Exciter with PSS enabled. A marked difference (decrease) in the number and amplitude of oscillations in the power (MW) variable indicates the effectiveness of PSS.

A further check is the Governor Stability Test. In the exemplary embodiment, this check uses a predefined set of frequency excursion simulation scenarios to verify the governor controller parameter can maintain the active power and reactive power in a stable state. For example, a 0.5% change in speed reference can be applied and removed with the sufficient operating range to not reach the maximum gate or stator output limit. Active power is monitored.

An optional check may be the Governor Operating Mode Test. In this test, the Governor is set at different operating modes, including OFF, based loaded (frequency non-responsive), and under load control. The above scenarios are evaluated using default dynamic parameters to see if the simulated response is better than the result during model validation. If true, then there is a high chance that the discrepancy during model validation is caused by the governor control mode mismatch.

In the exemplary embodiment, the function check process is a streamlined process for performing the function test and is based on historical simulation and scenarios. The function test process evaluates at different generator loads (dispatch range), grid strengths (strong and weak), frequency excursion events, and voltage events.

For example, the process may perform playback simulation using an impedance in parallel and another generator. The value of impedance can emulate the strong and weak grids. In some embodiments, an impedance of 0.2 pu represents a weak grid and an impedance of 0.03 represents a strong grid. The added impedance line can be used to emulate a voltage event including line trip and fault. The added generator can emulate a frequency excursion event for control function evaluation. The generator at the left side is the modeled generator and its load can also be adjusted based on the dispatch range and its type (based load and peaking). During simulations, multiple cases may be simulated, such as, but not limited to, simulation cases covering strong, medium and weak grid combined with generator full, medium, and min load. Each case needs to be initialized from a steady state simulation. Then the dynamic simulation including step test, impulse test, frequency event and voltage event can be emulated.

Figure 6:
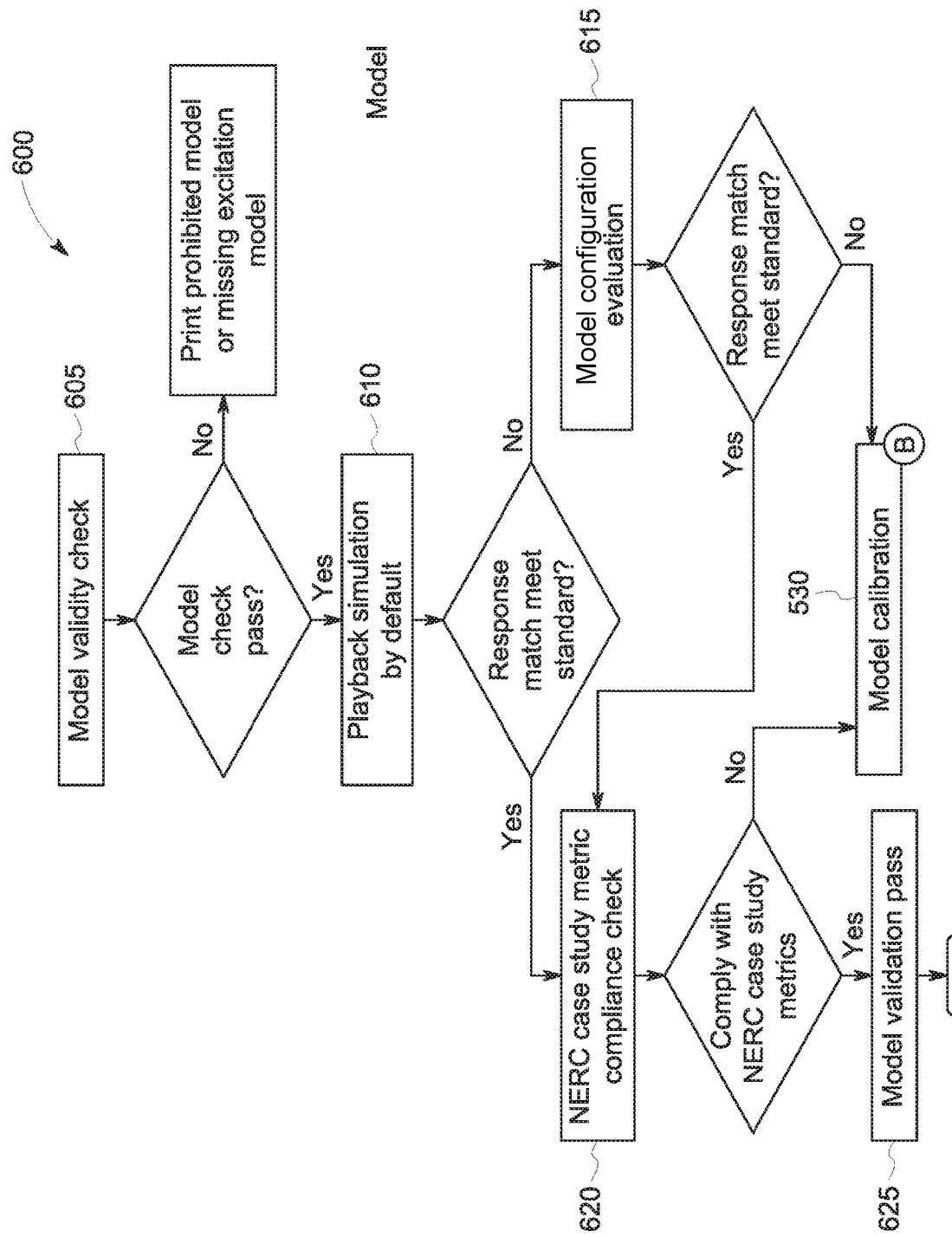
FIG. 6 illustrates a flow chart of a model validation process in accordance with the process shown in FIG. 5.

FIG. 6 illustrates a flow chart of a model validation process 600 in accordance with the process 500 (shown in FIG. 5). In the exemplary embodiment, process 600 shows how the Model Check 605, Parameter Check 620, and Model Configuration Evaluation Check 615 can be integrated into the Model Validation 520 (shown in FIG. 5). Prior to starting the playback simulation 610 to evaluate the curve fitting performance, process 600 will first perform the model check 605 to confirm the validity of models based on NERC List of Validate Models. The user will be notified if any prohibited model or missing excitation model in the dynamic model file has been identified. Based on this information, the user can further correct the dynamic model file if there is human error, or to use the model conversion module to convert any prohibited model to the valid models before evaluating the curve fitting performance. Of course, the user can also ignore the warning and continue the model validation process 600.

Once the model check 605 is successfully passed, the playback simulation 610 response using the given dynamic model parameters will be compared with the real measurement. The response matching result can be either acceptable or not depends on well-defined curve matching criteria and engineer judgement. If the results are not acceptable, then the model goes through the Model Configuration Evaluation Check 615. This Check 615 ensures that the generator model is "acceptable" at the both response space and parameter space. This is because a lot of governor modes in the dynamic model file are not consistent with the reality, which means the governor modes mismatch is common in practice. Furthermore, this Check 615 also evaluates the mode of the power system stabilizer (PSS). To avoid unnecessary model calibration on the already good model, the model validation will check the simulation response at different governor modes and different PSS modes (detail flowchart shown in FIG. 7). If any mode provides a more reasonable response, then that mode may be the true modes. And there is no need to further conduct model calibration if that response matching result is "acceptable" and the model proceeds to the parameter check 620. Otherwise, for example, if there is a mismatch between the modes, the model goes to model calibration 530.

The model may go to the Parameter Check 620 if the response match meets the standard, either from the playback simulation 610 or the Model Evaluation Configuration Check 615. The model will further go through the Parameter Check 620 (also known as the NERC Case Study Metric Compliance Check) even though the curve matching is acceptable, wherein the bounds and inequality constraints will be evaluated for relevant parameters. If the Parameter Check 620 fails, the model needs to go through the model calibration 530. If the Parameter Check 620 succeeds, the Model Validation Process 600 passes and process 500 is complete.

Figure 7:
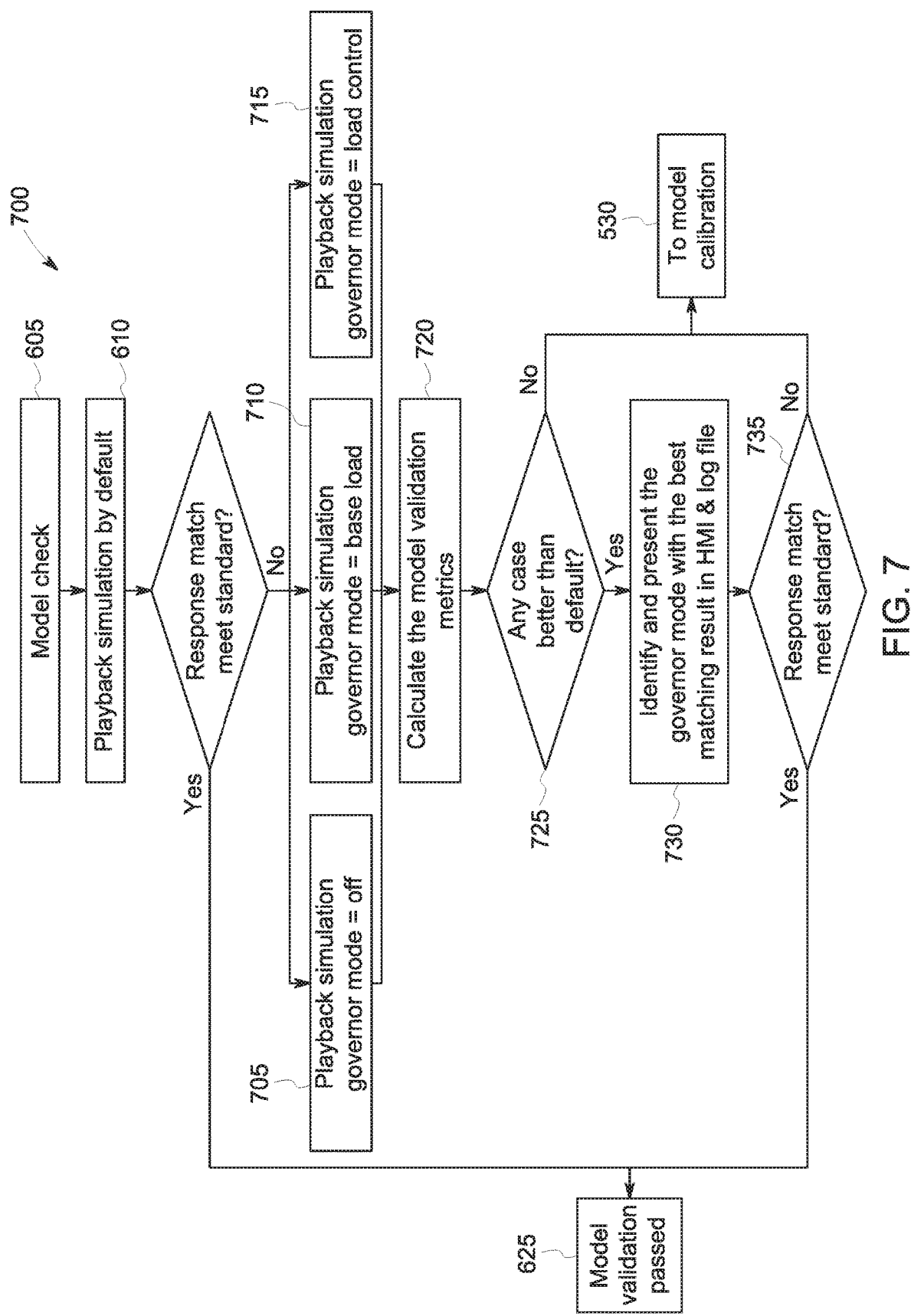
FIG. 7 illustrates a flow chart of a governor mode evaluation process in accordance with the model validation process shown in FIG. 6.

FIG. 7 illustrates a flow chart of a governor mode evaluation process 700 in accordance with the model validation process 600 shown in FIG. 6. In the exemplary embodiment, governor mode evaluation process 700 is similar to Model Configuration Evaluation Check 615 (shown in FIG. 6).

Process 700 begins after the simulation response is determined to no meet the standard. In process 700, three playback simulations are performed in parallel. Playback simulation A 705 is performed with the Governor Mode Off. Playback simulation B 710 is performed with the Governor Mode set to a base load. Playback simulation C 715 is performed with the Governor Mode set to load control. In some embodiments, the power system stabilizer (PSS) is also analyzed in both the ON and OFF positions for the three Governor mode playback simulations A-C 705-715. These additional simulations are also analyzed as described herein. The system calculates the model validation metrics 720 based on the results of the three playback simulations 705, 710, and 715 and determines 725 if any case is better than the default. If not, the system proceeds to model calibration 530. If true, then the system identifies and presents 730 the Governor Mode with the best matching result in the HMI 1025 and log 1030 files (both shown in FIG. 10). The system determines 730 if the response match meets the standard. If yes, then Model Validation Passes 625. Otherwise, the system proceeds to Model Calibration 530.

The response match criteria may be based on similarity metrics between the simulation response and the measurement data. Alternatively, the response match criteria may be based on similarity metrics between the feature of the simulation response and feature of the measurement data. If the similarity is above a predefined threshold, the response match is deemed as meeting the standard or threshold.

The features of the simulation response or the measurement data may include time domain features, frequency domain features, and time-frequency features.

Time domain features may include simply statistics such as mean, median, standard deviation, skewness, kurtosis, moving mean, moving median absolute deviation, root mean square, mode, quartile, range, and interquartile range of the data series. Time domain features may also include peak to peak difference or maximum-to-minimum difference along the time, upper and lower signal envelope, damping ratio, overshoot amplitude, peaking time, rising time, and settling time of the data series.

Frequency domain features may include signal to noise ratio, total harmonic distortion, power bandwidth, band power, mean frequency, median frequency, and frequency-response functions for modal analysis of the data series.

Time-frequency features may include spectral entropy of the data series, Joint moment of the time-frequency distribution of the data series, conditional spectral moment of the time-frequency distribution of the data series, and conditional temporal moment of the time-frequency distribution of the data series.

Similarity measures may include distance-based measures (e.g., Euclidean distance and Manhattan distance), statistical-based measures (e.g., correlation coefficient), and/or information-based measures (e.g., normalized information distance).

Other examples of similarity measures include but are not limited to:

Mean square errors (MSEs) or a mean squared deviation (MSD) of an estimator (e.g., of a procedure for estimating an unobserved quantity) may measure an average of the squares of errors—that is, the average squared difference between the estimated values and the actual value. MSE is a risk function, corresponding to the expected value of the squared error loss. The fact that MSE is almost always strictly positive (and not zero) is because of randomness or because the estimator does not account for information that could produce a more accurate estimate, for example.

A Manhattan distance includes a distance between two points measured along axes at right angles. A sum of absolute errors (SAE) comprises a sum of the absolute values of the vertical "residuals" between points generated by a function and corresponding points in the data.

A short time series (STS) distance may comprise a square of the gradient distance between two time series data, for example.

Cosine similarity refers to a measure of similarity between two non-zero vectors of an inner product space that measures the cosine of the angle between them. The cosine of 0° is 1, and is less than 1 for any angle in the interval (0,π] radians. A cosine similarity is thus a judgment of orientation and not magnitude: two vectors with the same orientation have a cosine similarity of 1, two vectors oriented at 90° relative to each other have a similarity of 0, and two vectors diametrically opposed have a similarity of −1, independent of their magnitude.

A correlation coefficient may comprise a numerical measure of some type of correlation, representing a statistical relationship between two variables. The variables may include two columns of a given data set of observations, e.g., a "sample," or two components of a multivariate random variable with a known distribution, for example.

Dynamic time warping (DTW) may include an algorithm for measuring similarity between two temporal sequences which may vary in speed. For instance, similarities in walking could be detected using DTW, even if one person was walking faster than the other, or if there were accelerations and decelerations during the course of an observation.

Figure 8:
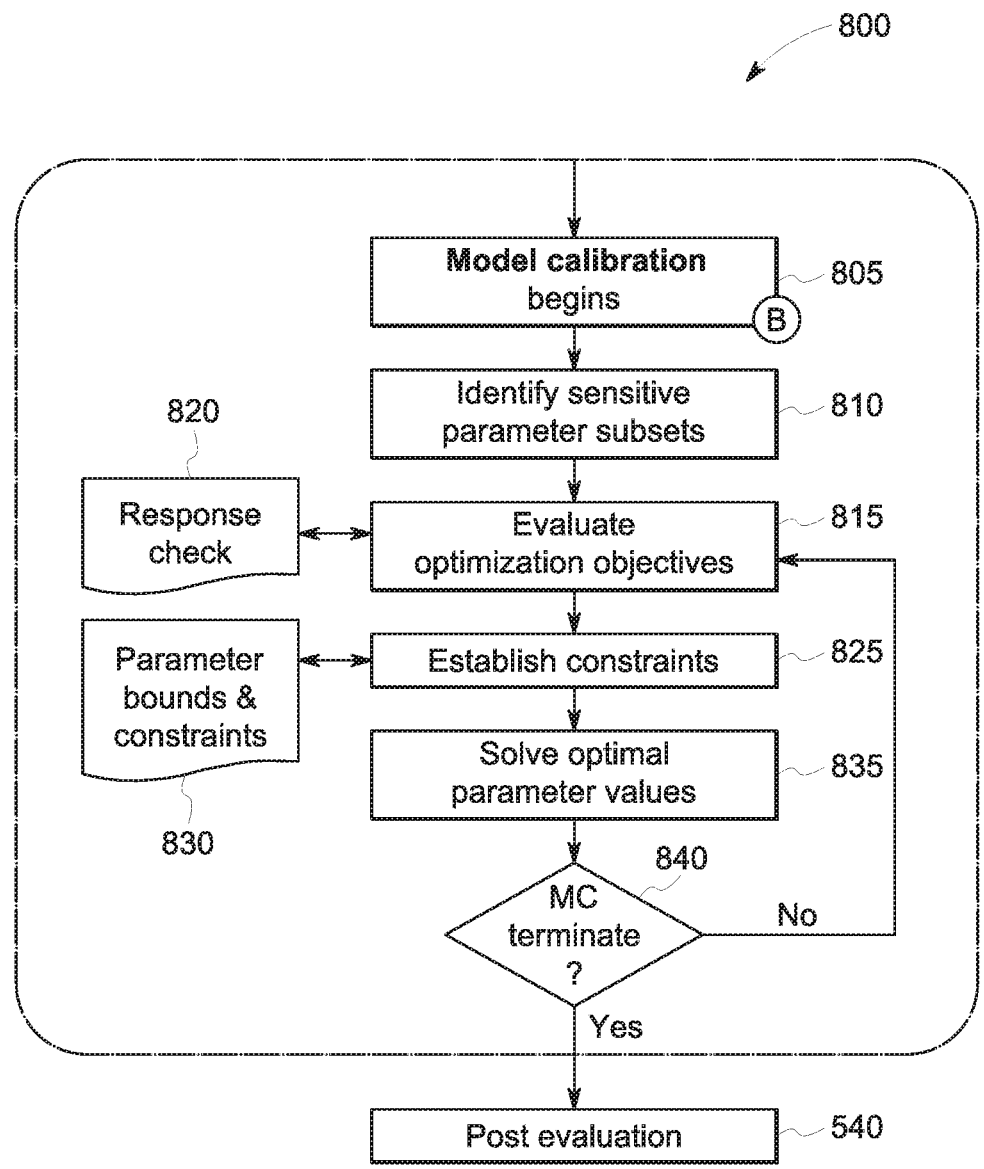
FIG. 8 illustrates a flow chart of a model calibration process in accordance with the process shown in FIG. 5.

FIG. 8 illustrates a flow chart of a model calibration process 800 in accordance with the process 500 (shown in FIG. 5). In the exemplary embodiment, the model calibration process 800 is similar to model calibration 530 (shown in FIG. 5). In the exemplary embodiment, model calibration process 800 begins 805 and identifies 810 sensitive parameter subsets. The optimization objectives are evaluated 815. This includes performing a response check 820 as described herein. The constraints are then established 825, which may include checking the parameter bounds and constraints 830, as described herein as a parameter check. The model calibration process 800 solves for the optimal parameter values 835 and determines whether or not to terminate 840. If the model calibration process 800 determines 840 to terminate, then proceed to Post Evaluation 540. Otherwise the process 800 proceeds back to evaluating the optimization objectives 815.

Figure 9:
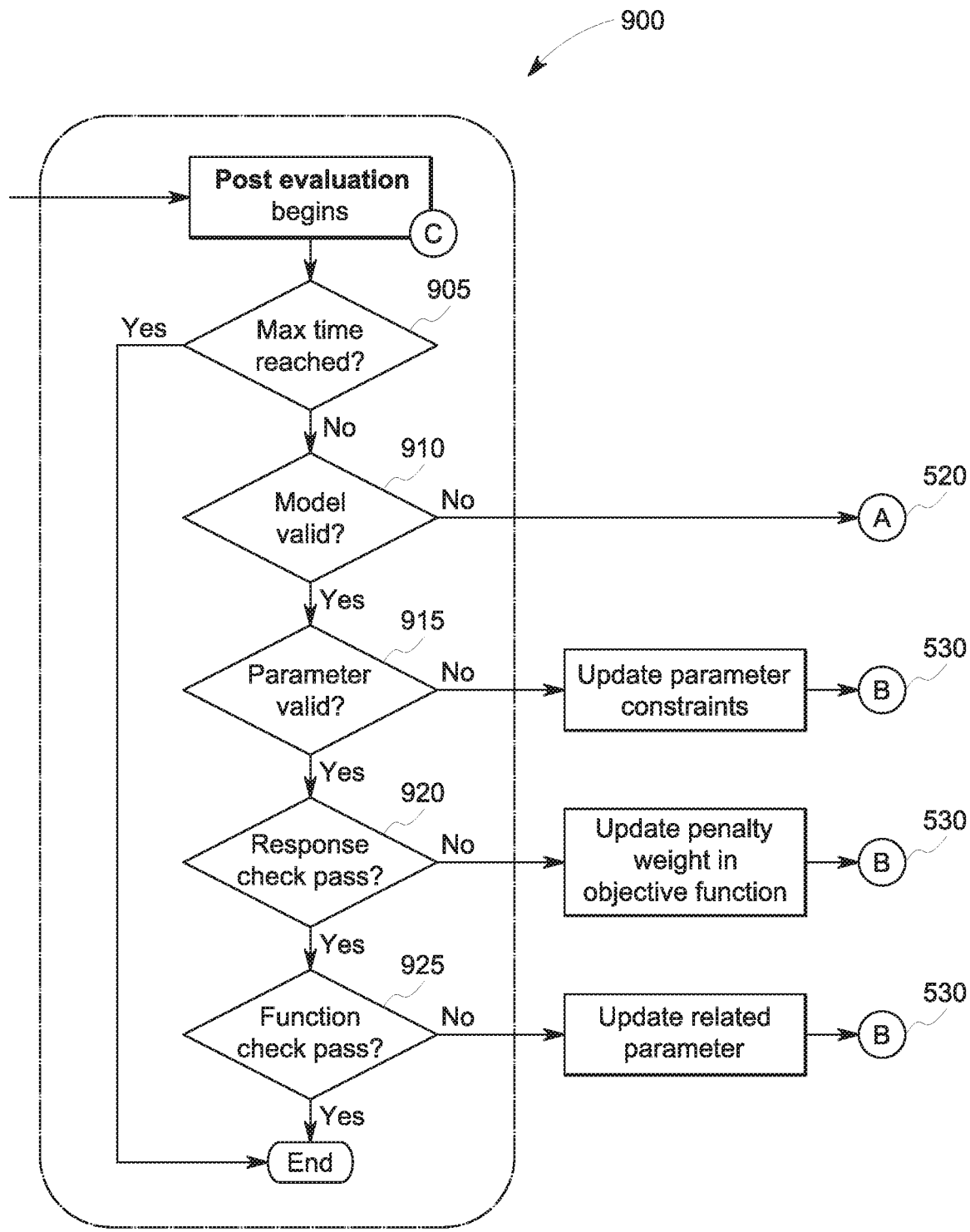
FIG. 9 illustrates a flow chart of a post evaluation process in accordance with the process shown in FIG. 5.

FIG. 9 illustrates a flow chart of a post evaluation process 900 in accordance with the process 500 (shown in FIG. 5). In the exemplary embodiment, the post evaluation process 900 is similar to Post Evaluation 540 (shown in FIG. 5). In the exemplary embodiment, post evaluation process 900 determines 905 if a max time limit has been reached. If the time limit has been reached, then the post evaluation process 900 ends. Otherwise, the post evaluation process 900 performs 910 a model check, as described herein. If the model check fails, then the post evaluation process 900 proceeds to Model Validation 520. Otherwise, the post evaluation process 900 performs 915 a parameter check, as described herein. If the parameter check fails, the post evaluation process 900 updates 920 the parameter constraints and proceeds to Model Calibration 530. Otherwise, the post evaluation process 900 performs 925 a response check as described herein. If the response check fails, the post evaluation process 900 updates 930 the penalty weights in the objective function and proceeds to Model Calibration 530. Otherwise, the post evaluation process 900 performs 935 the function check as described herein. If the function check fails, the post evaluation process 900 updates 940 the related parameter and proceeds to Model Calibration 530. Otherwise, the post evaluation process 900 ends.

Figure 10:
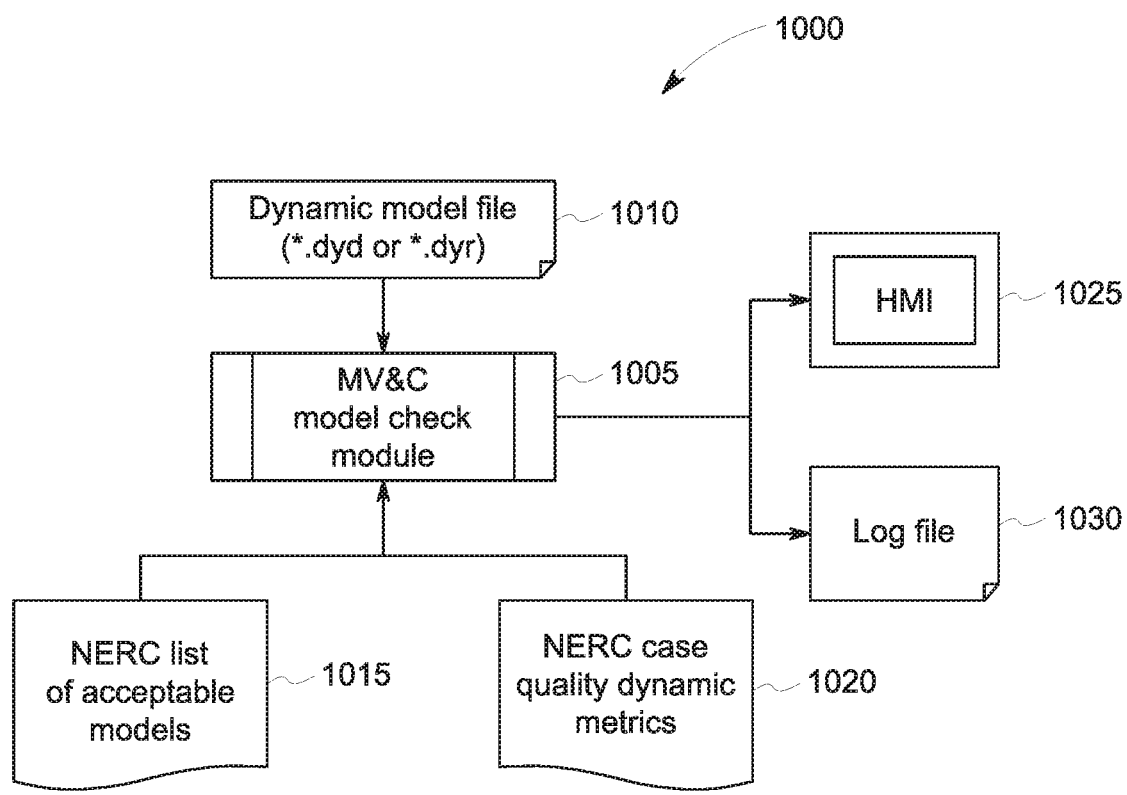
FIG. 10 illustrates a system for a model check in accordance with one embodiment of the disclosure.

FIG. 10 illustrates a system 1000 for a model check in accordance with one embodiment of the disclosure. The system 1000 shows a Model Check Module 1005 in the Model Validation and Calibration (MV&C) Platform. The Model Check Module 1005 receives a generator's dynamic model file 1010 (dyd file for PSLF simulation engine and dyr file for PSSE simulation engine). The Model Check Module 1005 reads the dynamic model file 1010 and also information from the latest NERC List of Acceptable Models 1015 and NERC Case Quality Dynamic Metrics 1020. After conducting the rule-based inference (as shown in FIG. 11), the Model Check Module 1005 generates warnings, guidance, and records, which may variously be stored in files, such as, but not limited to, HMI 1025 and Log 1030 files.

Figure 11:
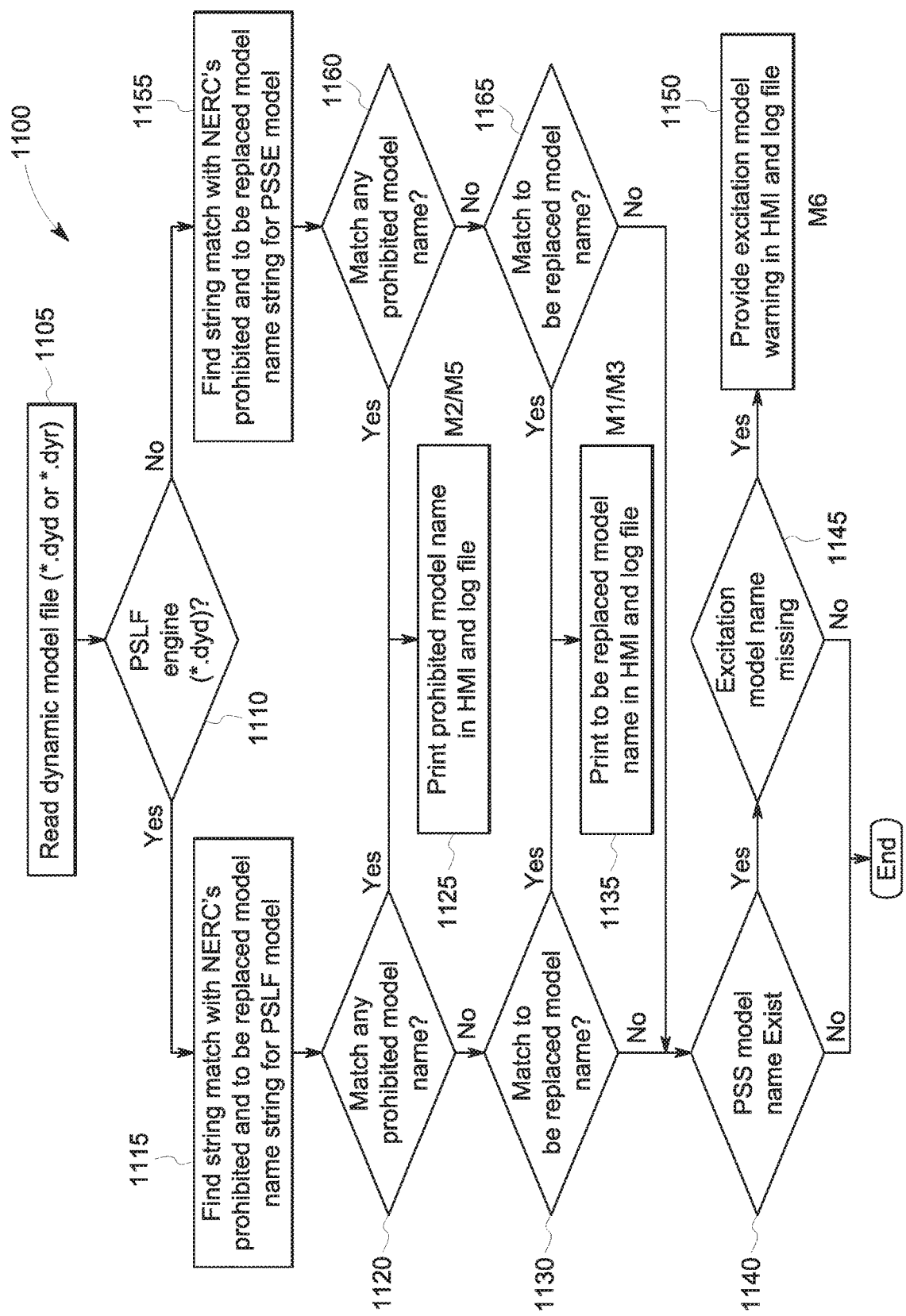
FIG. 11 illustrates a flow chart of a model check process using the system shown in FIG. 10.

FIG. 11 illustrates a flow chart of a model check process 1100 using the system 1000 (shown in FIG. 10). In the exemplary embodiment, the model check process 1100 is implemented by the Model Check Module 1005 (shown in FIG. 10). In the model check process 1100, M1 and M3 define rules for the "to be replaced" models. In the model check process 1100, the response to user is to print the model name to notify user. In other embodiments, the Model Check Module 1005 provides the user with the option to automatically convert the obsolete model to a recommended model.

In the exemplary embodiment, the Model Check Module 1005 reads 1105 the dynamic model file 1010 (shown in FIG. 10). Based on the dynamic model file 1010 type, the Model Check Module 1005 determines 1110 the related engine type. If the engine is a PSLF engine, then the Model Check Module 1005 finds 1115 (in the database) the string match with the NERC's prohibited and to be replaced model name strings for the PSLF model. The Model Check Module 1005 determines 1120 if the model in the dynamic model file 1010 matches any of the prohibited model names. If it matches a prohibited name, then the Model Check Module 1005 prints 1125 the prohibited model name to the HMI 1025 and log 1030 files (both shown in FIG. 10). If it does not match a prohibited name, the Model Check Module 1005 determines 1130 if the model in the dynamic model file 1010 matches any of the "to be replaced" model names. If it matches a "to be replaced" name, then the Model Check Module 1005 prints 1135 the replaced model name to the HMI 1025 and log 1030 files. If it does not match a "to be replaced" name, the Model Check Module 1005 determines 1140 if the PSS model name exists. If not, then the model check process 1100 ends. If it does exist, then the Model Check Module 1005 determines 1145 if the excitation model name is missing. If the model name is not missing, then the model check process 1100 ends. Otherwise, the Model Check Module 1005 provides 1150 an excitation model warning in the HMI 1025 and log 1030 files.

If the engine is not a PSLF engine in step 1100, then the Model Check Module 1005 finds 1155 (in the database) the string match with the NERC's prohibited and to be replaced model name strings for the PSSE model. The Model Check Module 1005 determines 1160 if the model in the dynamic model file 1010 matches any of the prohibited model names. If it matches a prohibited name, then the Model Check Module 1005 prints 1125 the prohibited model name to the HMI 1025 and log 1030 files. If it does not match a prohibited name, the Model Check Module 1005 determines 1165 if the model in the dynamic model file 1010 matches any of the "to be replaced" model names. If it matches a "to be replaced" name, then the Model Check Module 1005 prints 1135 the replaced model name to the HMI 1025 and log 1030 files. If it does not match a "to be replaced" name, the Model Check Module 1005 proceeds to step 1140.

Figure 12A:
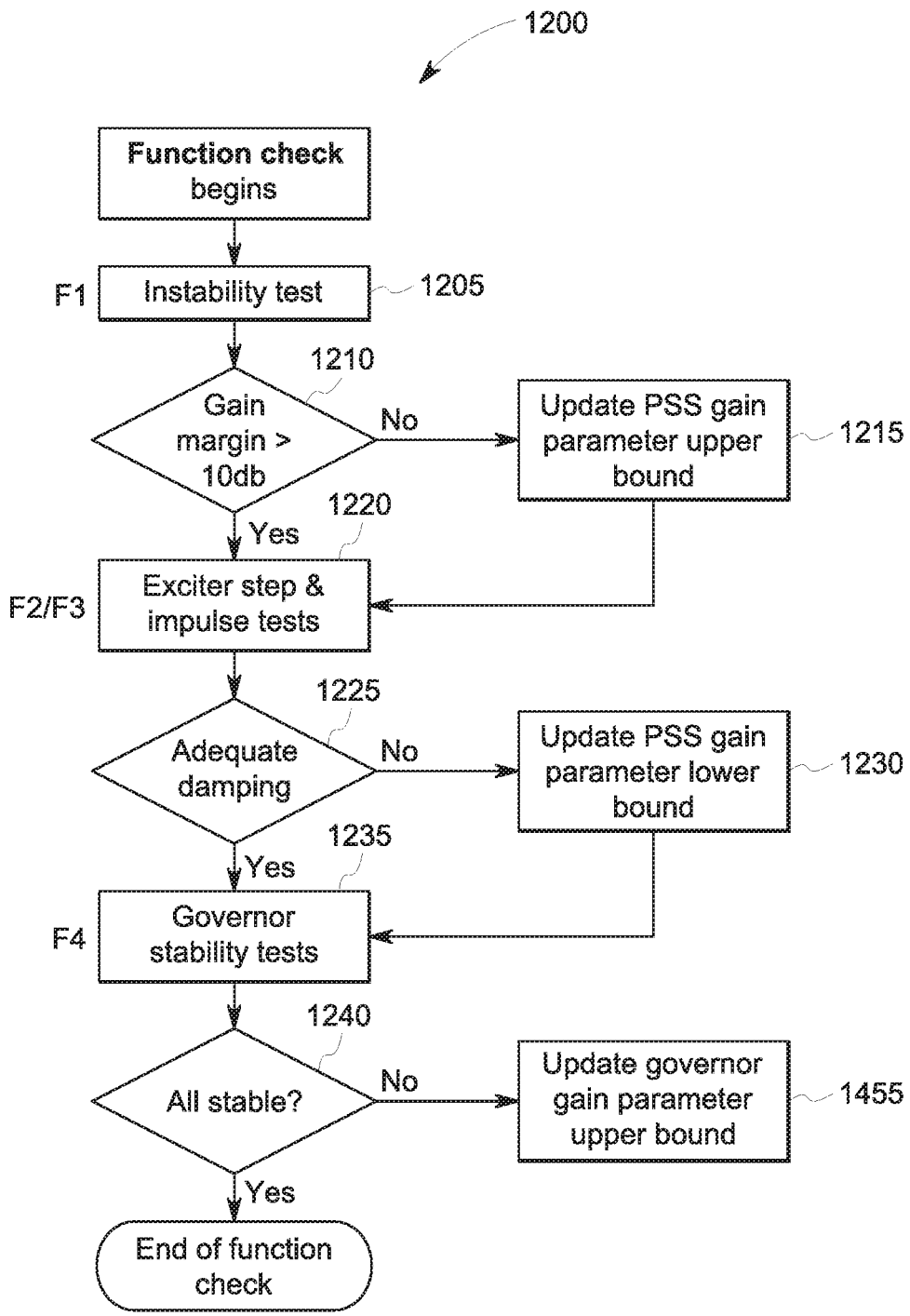
FIG. 12A illustrates a flow chart of a function check process in accordance with the post evaluation process shown in FIG. 9.

FIG. 12A illustrates a flow chart of a function check process 1200 in accordance with the post evaluation process 900 (shown in FIG. 9). In the exemplary embodiment, function check process 1200 is a streamlined process for performing the function test and is based on historical simulation and scenarios. The function test process 1200 evaluates at different generator loads (dispatch range), grid strengths (strong and weak), frequency excursion events, and voltage events.

Figure 12B:
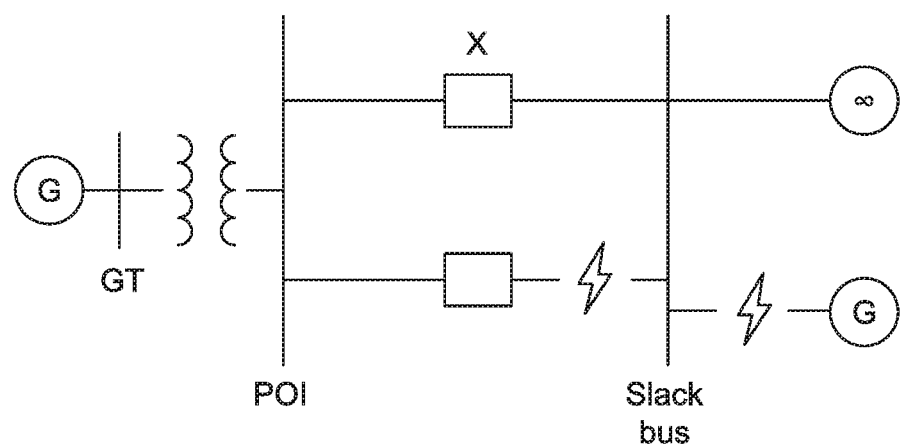
FIG. 12B illustrates a block diagram of an exemplary infinite bus simulation set-up for control function evaluation.

For example, the process 1200 may perform playback simulation using an impedance in parallel and another generator, as shown in FIG. 12B. The value of impedance can emulate the strong and weak grids. In some embodiments, an impedance of 0.2 pu represents a weak grid and an impedance of 0.03 represents a strong grid. The added impedance line can be used to emulate a voltage event including line trip and fault. The added generator can emulate a frequency excursion event for control function evaluation. The generator at the left side is the modeled generator and its load can also be adjusted based on the dispatch range and its type (based load and peaking).

During simulations, multiple cases may be simulated, such as, but not limited to, simulation cases covering strong, medium and weak grid combined with generator full, medium, and min load. Each case needs to be initialized from a steady state simulation. Then the dynamic simulation including step test, impulse test, frequency event and voltage event can be emulated as represented by X in Table 1.

TABLE 1

| Load level | Grid strength | | |
| --- | --- | --- | --- |
| | Strong | Medium | Weak |
| Full load | X | X | X |
| Medium load | X | X | X |
| Min load | X | X | X |

In the exemplary embodiment, the function check process 1200 begins with the instability check 1205 as described herein. The function check process 1200 determines 1210 whether the gain margin from the instability test 1205 is less than 10 db. If not, the function check process 1200 updates 1215 the PSS gain parameter upper bound prior to proceeding to step 1220. In the exemplary embodiment, the function check process 1200 determines 1210 the gain margin over a range of operating conditions, such as by dispatch varying from 30% to 100% with grid impendence varying over a range to account for different short circuit strengths at the point of interconnection. The function check process 1200 conducts 1220 the exciter step and impulse steps. The function check process 1200 determines 1225 if there is adequate damping. If not, then the function check process 1200 updates 1230 the PSS gain parameter lower bound prior to proceeding to step 1235. The function check process 1200 conducts 1235 the governor stability tests and determines 1240 if everything is stable. If not, then the function check process 1200 updates 1245 the gain parameter upper bound. Otherwise, the function check process 1200 ends.

Figure 13:
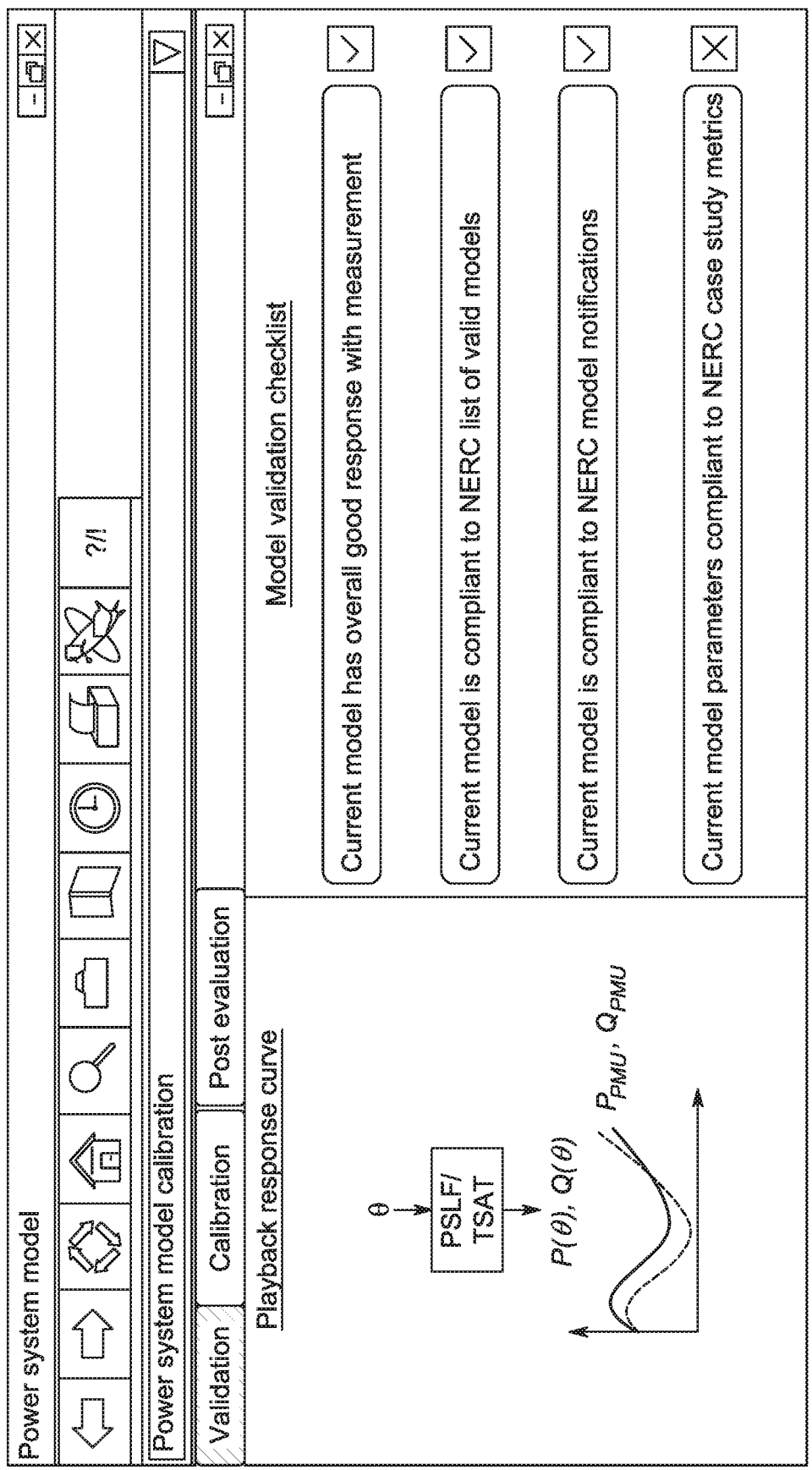
FIG. 13 is an exemplary user interface for a model validation checklist in accordance with at least one embodiment.

FIG. 13 is an exemplary user interface for a model validation checklist in accordance with at least one embodiment. This user interface includes a model validation checklist for displaying the pass/fail results of Model Validation 520 (shown in FIG. 5). The checklist allows a user to quickly determine the results of Model Validation 520. In some embodiments, the user may select a checklist item to learn more about the results, such as to view the corresponding HMI 1025 and log 1030 files (both shown in FIG. 10).

Figure 14:
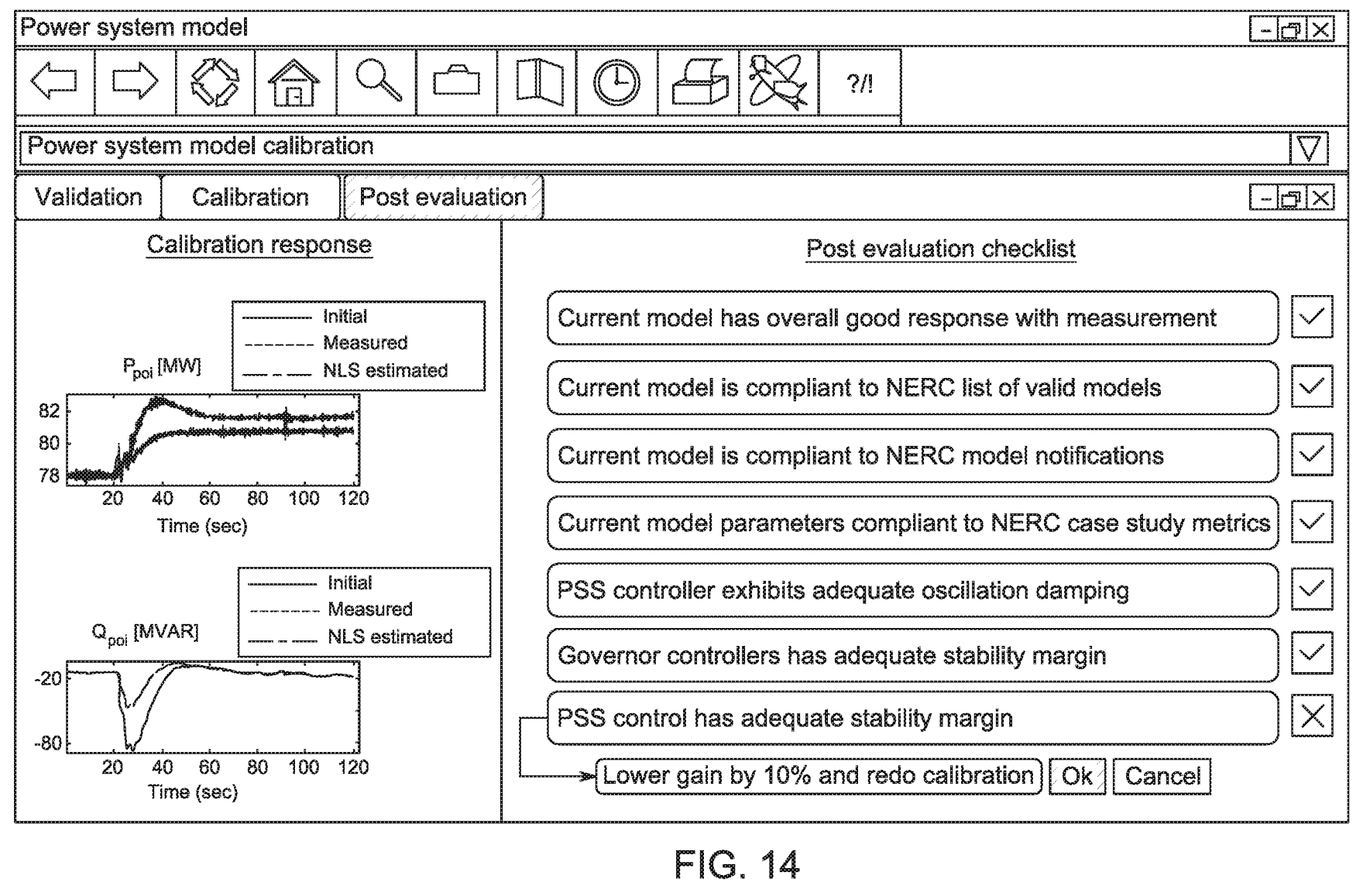

FIG. 14 is an exemplary user interface for a post evaluation checklist in accordance with at least one embodiment. This user interface includes a post evaluation checklist for displaying the pass/fail results of Post Evaluation 540 (shown in FIG. 5). The checklist allows a user to quickly determine the results of Post Evaluation 540. In some embodiments, the user may select a checklist item to learn more about the results, such as to view the corresponding HMI 1025 and log 1030 files (both shown in FIG. 10).

FIG. 15 illustrates a model calibration algorithm that can be used by the model calibration algorithm component in accordance with some embodiments. Here, the model calibration algorithm attempts to find a parameter value (θ*) for a parameter (or parameters) of the power system model that creates a matching output between the simulated active power ($\hat{P}$) and the simulated reactive power ($\hat{Q}$) predicted by the model with respect to the actual active power (P) and actual reactive power (Q) of the component on the electrical grid.

As grid disturbances occur intermittently, the user of the calibration tool described herein may be required to re-calibrate model parameters in a sequential manner as new disturbances come in. In this scenario, the user has a model that was calibrated to some observed grid disturbances to start with, and observes a larger that acceptable mismatch with a newly encountered disturbance. The task now is to tweak the model parameters so that the model explains the new disturbance without detrimentally affecting the match with earlier disturbances. One solution would be to run calibration simultaneously on all events of interest strung together but this comes at the cost of significant computational expense and engineering involved in enabling running a batch of events simultaneously. It would be far more preferable to carry some essential information from the earlier calibrations runs and guide the subsequent calibration run that helps explain the new disturbance without losing earlier calibration matches.

In the exemplary embodiment, the framework of Bayesian estimation may be used to develop a sequential estimation capability into the existing calibration framework. The true posterior distribution of parameters (assuming Gaussian priors) after the calibration process can be quite complicated due to the nonlinearity of the models. The typical approach in sequential estimation is to consider a Gaussian approximation of this posterior as is done in Kalman filtering approaches to sequential nonlinear estimation. In a nonlinear least squares approach, this boils down to a quadratic penalty term for deviations from the previous estimates, and the weights for this quadratic penalty come from a Bayesian argument.

Figure 16:
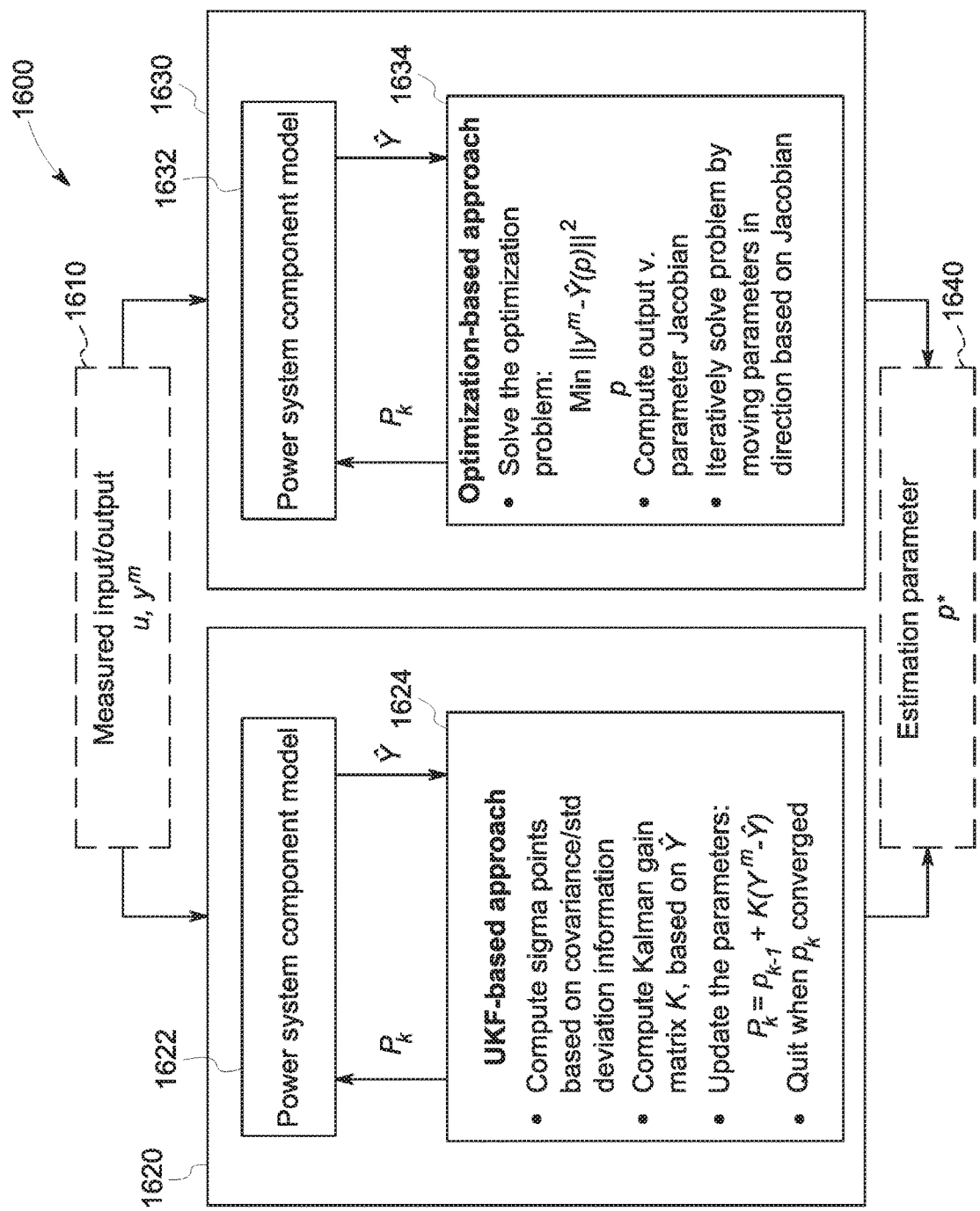
FIG. 16 is a diagram illustrating candidate parameter estimation algorithms in accordance with some embodiments.

FIG. 16 illustrates candidate parameter estimation algorithms 1600 according to some embodiments. In one approach 1620, measured input/output data 1610 (u, y$^m$) may be used by a power system component model 1622 and an UKF based approach 1624 to create an estimation parameter (p*) 1640.

In particular, the system may compute sigma points based on covariance and standard deviation information. The Kalman Gain matrix K may be computed based on $\hat{Y}$ and the parameters may be updated based on:

$$p_k = p_{k-1} + K(y^m - \hat{y})$$

until $p_k$ converges. According to another approach 1130, the measured input/output data 1610 (u, y$^m$) may be used by a power system component model 1632 and an optimization-based approach 1634 to create the estimation parameter (p*) 1640. In this case, the following optimization problem may be solved:

$$\min_p \lVert y^m - \hat{Y}(p) \rVert^2$$

The system may then compute output as compared to parameter Jacobian information and iteratively solve the above optimization problem by moving parameters in directions indicated by the Jacobian information.

Figure 17:
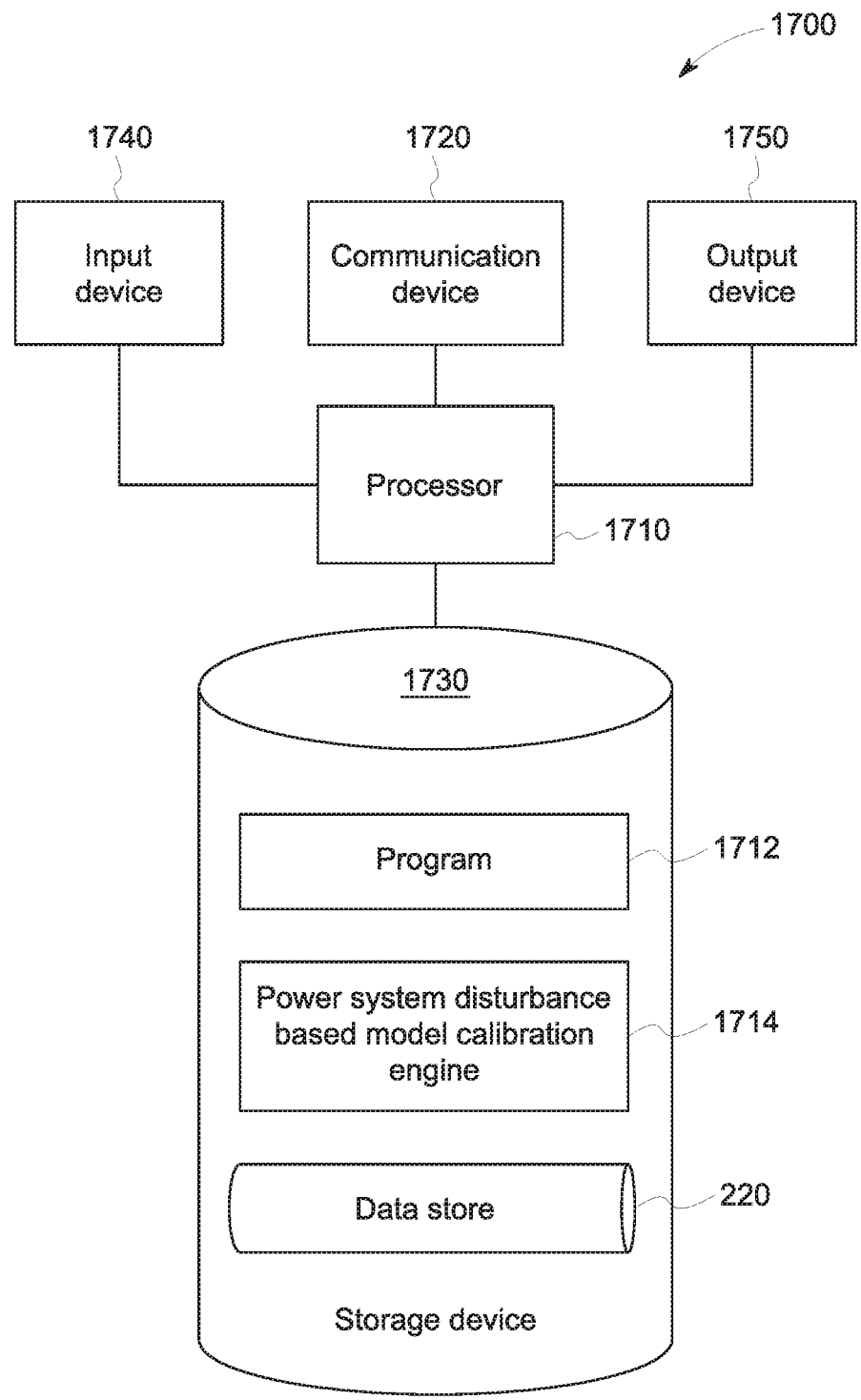
FIG. 17 is a diagram illustrating an exemplary apparatus or platform according to some embodiments.

The embodiments described herein may also be implemented using any number of different hardware configurations. For example, FIG. 17 is a block diagram of an apparatus or platform 1700 that may be, for example, associated with the system 200 of FIG. 2A and/or any other system described herein. The platform 1700 comprises a processor 1710, such as one or more commercially available Central Processing Units ("CPUs") in the form of one-chip microprocessors, coupled to a communication device 1760 configured to communicate via a communication network (not shown in FIG. 17). The communication device 1760 may be used to communicate, for example, with one or more remote measurement units, components, user interfaces, etc. The platform 1700 further includes an input device 1740 (e.g., a computer mouse and/or keyboard to input power grid and/or modeling information) and/an output device 1750 (e.g., a computer monitor to render a display, provide alerts, transmit recommendations, and/or create reports). According to some embodiments, a mobile device, monitoring physical system, and/or PC may be used to exchange information with the platform 1700.

The processor 1710 also communicates with a storage device 1730. The storage device 1730 may comprise any appropriate information storage device, including combinations of magnetic storage devices (e.g., a hard disk drive), optical storage devices, mobile telephones, and/or semiconductor memory devices. The storage device 1730 stores a program 1712 and/or a power system disturbance based model calibration engine 1714 for controlling the processor 1710. The processor 1710 performs instructions of the programs 1712, 1714, and thereby operates in accordance with any of the embodiments described herein. For example, the processor 1710 may calibrate a dynamic simulation engine, having system parameters, associated with a component of an electrical power system (e.g., a generator, wind turbine, etc.). The processor 1710 may receive, from a measurement data store, measurement data measured by an electrical power system measurement unit (e.g., a phasor measurement unit, digital fault recorder, or other means of measuring frequency, voltage, current, or power phasors). The processor 1710 may then pre-condition the measurement data and set-up an optimization problem based on a result of the pre-conditioning. The system parameters of the dynamic simulation engine may be determined by solving the optimization problem with an iterative method until at least one convergence criteria is met. According to some embodiments, solving the optimization problem includes a Jacobian approximation that does not call the dynamic simulation engine if an improvement of residual meets a pre-defined criteria.

The programs 1712, 1714 may be stored in a compressed, uncompiled and/or encrypted format. The programs 1712, 1714 may furthermore include other program elements, such as an operating system, clipboard application, a database management system, and/or device drivers used by the processor 1710 to interface with peripheral devices.

As used herein, information may be "received" by or "transmitted" to, for example: (i) the platform 1700 from another device; or (ii) a software application or module within the platform 1700 from another software application, module, or any other source.

At least one of the technical solutions to the technical problems provided by this system may include: (i) improved speed in modeling parameters; (ii) more robust models in response to measurement noise; and (iii) compliance with NERC mandated grid reliability requirements.

The methods and systems described herein may be implemented using computer programming or engineering techniques including computer software, firmware, hardware, or any combination or subset thereof, wherein the technical effects may be achieved by performing at least one of the following steps: (a) store, in the at least one memory device, a plurality of models for a plurality of devices and a plurality of input files associated with the plurality of models; (b) receive, from a user, a selection of a model of the plurality of models to simulate; (c) retrieve, from the at least one memory device, one or more input files of the plurality of input files; (d) perform a model validity check on the selected model; (e) if the selected model passed the model validity check, perform a model calibration on the selected model; and (f) if the selected model passed the model calibration, perform a post evaluation on the selected model.

The computer-implemented methods discussed herein may include additional, less, or alternate actions, including those discussed elsewhere herein. The methods may be implemented via one or more local or remote processors, transceivers, servers, and/or sensors, and/or via computer-executable instructions stored on non-transitory computer-readable media or medium.

Additionally, the computer systems discussed herein may include additional, less, or alternate functionality, including that discussed elsewhere herein. The computer systems discussed herein may include or be implemented via computer-executable instructions stored on non-transitory computer-readable media or medium.

A processor or a processing element may employ artificial intelligence and/or be trained using supervised or unsupervised machine learning, and the machine learning program may employ a neural network, which may be a convolutional neural network, a deep learning neural network, or a combined learning module or program that learns in two or more fields or areas of interest. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as image data, text data, report data, and/or numerical analysis. The machine learning programs may utilize deep learning algorithms that may be primarily focused on pattern recognition, and may be trained after processing multiple examples. The machine learning programs may include Bayesian program learning (BPL), voice recognition and synthesis, image or object recognition, optical character recognition, and/or natural language processing—either individually or in combination. The machine learning programs may also include natural language processing, semantic analysis, automatic reasoning, and/or machine learning.

In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. In unsupervised machine learning, the processing element may be required to find its own structure in unlabeled example inputs. In one embodiment, machine learning techniques may be used to extract data about the computer device, the user of the computer device, the computer network hosting the computer device, services executing on the computer device, and/or other data.

Based upon these analyses, the processing element may learn how to identify characteristics and patterns that may then be applied to training models, analyzing sensor data, and detecting abnormalities.

As will be appreciated based upon the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium, such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

In another embodiment, a computer program is provided, and the program is embodied on a computer-readable medium. In an example embodiment, the system is executed on a single computer system, without requiring a connection to a server computer. In a further example embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). In a further embodiment, the system is run on an iOS® environment (iOS is a registered trademark of Cisco Systems, Inc. located in San Jose, Calif.). In yet a further embodiment, the system is run on a Mac OS® environment (Mac OS is a registered trademark of Apple Inc. located in Cupertino, Calif.). In still yet a further embodiment, the system is run on Android® OS (Android is a registered trademark of Google, Inc. of Mountain View, Calif.). In another embodiment, the system is run on Linux® OS (Linux is a registered trademark of Linus Torvalds of Boston, Mass.). The application is flexible and designed to run in various different environments without compromising any major functionality.

In some embodiments, the system includes multiple components distributed among a plurality of computer devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes. The present embodiments may enhance the functionality and functioning of computers and/or computer systems.

As used herein, an element or step recited in the singular and preceded by the word "a" or "an" should be understood as not excluding plural elements or steps, unless such exclusion is explicitly recited. Furthermore, references to "example embodiment," "exemplary embodiment," or "one embodiment" of the present disclosure are not intended to be interpreted as excluding the existence of additional embodiments that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system for enhanced power system model validation comprising a computing device including at least one processor in communication with at least one memory device, wherein the at least one processor is programmed to:
   store, in the at least one memory device, a plurality of models for a plurality of devices and a plurality of input files associated with the plurality of models;
   receive, from a user, a selection of a model of the plurality of models to simulate;
   retrieve, from the at least one memory device, one or more input files of the plurality of input files;
   perform a playback simulation with governor mode set to off;
   perform a playback simulation with governor mode set to a base load;
   perform a playback simulation with governor mode set to load control;
   perform a model validity check on the selected model based on three governor mode playback simulations;
   if the selected model passed the model validity check, perform a model calibration on the selected model; and
   if the selected model passed the model calibration, perform a post evaluation on the selected model.

2. The system in accordance with claim 1, wherein the at least one processor is further programmed to:
   compare the selected model to one or more prohibited models;
   compare the selected model to one or more "to be replaced" models; and
   determine whether the selected model passed the model validity check based on the two comparisons.

3. The system in accordance with claim 1, wherein the at least one processor is further programmed to:
   determine that the selected model matches a "to be replaced" model based on the comparison; and
   replace the selected model with a replacement model.

4. The system in accordance with claim 1, wherein the at least one processor is further programmed to:
   evaluate one or more governor modes in relation to the selected model; and
   determine whether to perform the model calibration based on the evaluation.

5. The system in accordance with claim 4, wherein the at least one processor is further programmed to perform the evaluation of the governor modes in parallel.

6. The system in accordance with claim 1, wherein the at least one processor is further programmed to perform one or more parameter checks on the selected model.

7. The system in accordance with claim 6, wherein the one or more parameter checks include at least one check of consistent generator reactance, consistent time constraints, reasonable initial constraints, reasonable saturation factors, speed damping coefficients, consistent lead-lag time constants, power development fractions, and DC exciter self-excitation.

8. The system in accordance with claim 1, wherein the at least one processor is further programmed to perform a simulated response check using the selected model to compare the measured responses, wherein the simulated response check includes at least one of phase shift, amplitude, and damping ratio.

9. The system in accordance with claim 1, wherein the at least one processor is further programmed to perform a function check on the selected model, wherein the function check includes at least one of an instability gain margin test, stability evaluations at various conditions, an exciter step test, and a speed step test.

10. The system in accordance with claim 9, wherein the function check also includes at least one of a governor stability test and a governor operating mode test.

11. The system in accordance with claim 1, wherein the at least one processor is further programmed to perform an additional model validation check if the post evaluation fails.

12. The system in accordance with claim 1, wherein the at least one processor is further programmed to perform an additional model calibration if the post evaluation fails.

13. A method for enhanced power system model validation, the method implemented on a computing device including at least one processor in communication with at least one memory device, the method comprises:
   storing, in the at least one memory device, a plurality of models for a plurality of devices and a plurality of input files associated with the plurality of models;
   receiving, from a user, a selection of model of the plurality of models to simulate;
   retrieving, from the at least one memory device, one or more input files of the plurality of input files;
   performing a playback simulation with governor mode set to off;
   performing a playback simulation with governor mode set to a base load;
   performing a playback simulation with governor mode set to load control;
   performing a model validity check on the selected model based on three governor mode playback simulations;
   if the selected model passed the model validity check, performing a model calibration on the selected model; and
   if the selected model passed the model calibration, performing a post evaluation on the selected model.

14. The method in accordance with claim 13 further comprising:
   comparing the selected model to one or more prohibited models;
   comparing the selected model to one or more "to be replaced" models; and
   determining whether the selected model passed the model validity check based on the two comparisons.

15. The method in accordance with claim 13 further comprising:
   evaluating one or more governor modes in relation to the selected model; and
   determining whether to perform the model calibration based on the evaluation.

16. The method in accordance with claim 13 further comprising performing one or more parameter checks on the selected model, wherein the one or more parameter checks include at least one check of consistent generator reactance, consistent time constraints, reasonable initial constraints, reasonable saturation factors, speed damping coefficients, consistent lead-lag time constants, power development fractions, and DC exciter self-excitation.

17. The method in accordance with claim 13 further comprising performing a simulated response check using the selected model to compare the measured responses, wherein the simulated response check includes at least one of phase shift, amplitude, and damping ratio.

18. The method in accordance with claim 13 further comprising performing a function check on the selected model, wherein the function check includes at least one of an instability gain margin test, stability evaluations at various conditions, an exciter step test, a speed step test, a governor stability test, and a governor operating mode test.

19. The method in accordance with claim 13 further comprising performing at least one of an additional model validation check and an additional model calibration if the post evaluation fails.

* * * * *